United States Patent
Petit et al.

(10) Patent No.: US 12,541,147 B2
(45) Date of Patent: Feb. 3, 2026

(54) IMPRINTING APPARATUS

(71) Applicant: KONINKLIJKE PHILIPS N.V., Eindhoven (NL)

(72) Inventors: Didier Mathijs Maria Justina Petit, Aachen (DE); Marcus Antonius Verschuuren, Eindhoven (NL); Jens Udo Barendt, Aachen (DE)

(73) Assignee: Koninklijke Philips N.V., Eindhoven (NL)

( * ) Notice: Subject to any disclaimer, the term of this patent is extended or adjusted under 35 U.S.C. 154(b) by 199 days.

(21) Appl. No.: 18/580,176

(22) PCT Filed: Jul. 19, 2022

(86) PCT No.: PCT/EP2022/070160
§ 371 (c)(1),
(2) Date: Jan. 18, 2024

(87) PCT Pub. No.: WO2023/001802
PCT Pub. Date: Jan. 26, 2023

(65) Prior Publication Data
US 2024/0329521 A1    Oct. 3, 2024

(30) Foreign Application Priority Data

Jul. 21, 2021  (EP) ..................... 21186845
Jul. 21, 2021  (EP) ..................... 21186847
(Continued)

(51) Int. Cl.
G03F 7/00       (2006.01)
B29C 33/42      (2006.01)
(Continued)

(52) U.S. Cl.
CPC .......... G03F 7/0002 (2013.01); B29C 33/424 (2013.01); B29C 43/021 (2013.01);
(Continued)

(58) Field of Classification Search
CPC .... G03F 7/0002; G03F 7/707; G03F 7/70733; G03F 7/70758; G03F 7/70775;
(Continued)

(56) References Cited

U.S. PATENT DOCUMENTS 9,429,837 B2   8/2016  Van Bommel
9,440,254 B2   9/2016  Verschuuren
(Continued)

FOREIGN PATENT DOCUMENTS

WO    2004013693 A2    2/2004

OTHER PUBLICATIONS

Advanced Materials, 1998, vol. 10(8), p. 571.
International Search Report for PCT/EP2022/070160 filed Jul. 19, 2022.

*Primary Examiner* — Deoram Persaud

(57) ABSTRACT

An imprinting apparatus comprises a first carrier for carrying a flexible stamp having an imprinting pattern and a second carrier movable relative to the first carrier and configured to carry a substrate having a resist layer. The second carrier comprises a chuck and an interface plate over the chuck, wherein the interface plate comprises an array of openings for receiving already-imprinted areas of one side of a substrate while an opposite side of the substrate is to be imprinted. The chuck comprises a fluid passage arrangement for coupling to the openings of the array.

19 Claims, 18 Drawing Sheets

(30) Foreign Application Priority Data

| Jul. 21, 2021 | (EP) | 21186853 |
| Jul. 21, 2021 | (EP) | 21186856 |
| Jul. 21, 2021 | (EP) | 21186862 |
| Jul. 21, 2021 | (EP) | 21186871 |
| Jul. 21, 2021 | (EP) | 21186879 |

(51) Int. Cl.
  *B29C 43/02* (2006.01)
  *B29C 43/58* (2006.01)
  *B29C 59/00* (2006.01)
  *B29C 59/02* (2006.01)
  *B29K 105/00* (2006.01)

(52) U.S. Cl.
  CPC ............ *B29C 43/58* (2013.01); *B29C 59/002* (2013.01); *B29C 59/02* (2013.01); *G03F 7/707* (2013.01); *G03F 7/70733* (2013.01); *G03F 7/70758* (2013.01); *G03F 7/70775* (2013.01); *G03F 7/70783* (2013.01); *G03F 7/70875* (2013.01); *B29C 2033/426* (2013.01); *B29C 2043/025* (2013.01); *B29K 2105/0061* (2013.01)

(58) Field of Classification Search
  CPC ............ G03F 7/70783; G03F 7/70875; H01L 21/67259; H01L 21/68742; H01L 21/68785

See application file for complete search history.

(56) References Cited

U.S. PATENT DOCUMENTS

| 9,877,920 | B2 | 1/2018 | Desimone |
| 10,088,747 | B2 | 10/2018 | Verschuuren |
| 2004/0261981 | A1 | 12/2004 | Mccoy |
| 2004/0264019 | A1 | 12/2004 | Curtiss |
| 2005/0184436 | A1 | 8/2005 | Jeong |
| 2005/0196702 | A1* | 9/2005 | Bryant .................... A61L 27/56 430/311 |
| 2005/0214661 | A1* | 9/2005 | Stasiak .................... C12Q 1/68 257/E21.585 |
| 2005/0230882 | A1 | 10/2005 | Watts |
| 2006/0005657 | A1 | 1/2006 | Choi |
| 2009/0068570 | A1* | 3/2009 | Peckerar ................... G03F 1/54 430/5 |
| 2013/0140838 | A1 | 6/2013 | Wang |
| 2013/0300031 | A1 | 11/2013 | Torii |
| 2017/0186641 | A1 | 6/2017 | Horiuchi |
| 2018/0321602 | A1 | 11/2018 | Lafarre |
| 2022/0288815 | A1 | 9/2022 | Verschuuren |

* cited by examiner

IMPRINTING APPARATUS

CROSS-REFERENCE TO PRIOR APPLICATIONS

This application claims the priority benefit under 35 U.S.C. § 371 of International Patent Application No. PCT/EP2022/070160, filed on Jul. 19, 2022, which claims the priority benefit of EP patent application Ser. No. 21/186,845.0, filed on Jul. 21, 2021, EP patent application Ser. No. 21/186,847.6, filed on Jul. 21, 2021, EP patent application Ser. No. 21/186,853.4, filed on Jul. 21, 2021, EP patent application Ser. No. 21/186,856.7, filed on Jul. 21, 2021, EP patent application Ser. No. 21/186,862.5, EP patent application Ser. No. 21/186,871.6, filed Jul. 21, 2021 and EP patent application Ser. No. 21/186,879.9, filed on Jul. 21, 2021, the contents of which are herein incorporated by reference.

FIELD OF THE INVENTION

The present invention relates to an apparatus for imprinting a resist layer with an imprinting pattern on a flexible stamp and to an interface plate for use in such apparatus.

BACKGROUND OF THE INVENTION

Imprint lithography, of the type disclosed in EP 3126909A, is gaining interest as a viable alternative to more traditional mask-based optical lithography techniques, as imprint lithography promises to be able to provide small(ler) feature sizes in a pattern to be transferred onto a substrate such as the substrate of a semiconductor device over a large area. In imprint lithography techniques such as Substrate Conformal Imprinting Lithography ("SCIL"), a flexible stamp including a feature relief pattern on its surface is brought into contact with a substrate, which typically carries a resist material. The resist material is imprinted by the feature pattern. The resist material is subsequently developed, e.g., cured, after which the feature pattern is released from the resist material to leave a patterned resist layer on the substrate.

In this process, a curable but fluid resist layer is applied to the substrate (e.g., a wafer) supported on a chuck. The flexible stamp is for example rubber and resist layer may be cured (solidified) while being imprinted to leave the solidified relief in the resist layer which is complementary to that of the stamp relief layer after removal of the stamp from the resist. The imprint process entails arranging the thin flexible stamp, for example formed of a PDMS rubber layer adhered to a thin flexible plate such as e.g., a metal plate or glass plate with the relief surface of PDMS layer opposing the glass plate side, onto a stamp manipulator. This stamp manipulator is also known as a groove plate. This provides that the glass plate is against the stamp manipulator and the stamp's relief surface opposes the resist layer of the wafer on the chuck.

The stamp generally, but not necessarily, is held above the wafer upside down and with the two parts parallel to each other in the X-Y plane and at a small distance along the Z-axis direction from the surface of the fluidic resist layer. This small distance defines a so-called imprint gap between the relief surface of the stamp and the resist layer along the Z-axis direction.

The stamp may be locally manipulated, for example locally and sequentially released from and adhered to the stamp manipulator by the stamp manipulator. The stamp manipulator has openings, often in the form of grooves extending along the surface (X-Y plane) of the stamp manipulator, hence the name groove plate, that can be individually operated at set pressures such as over- or underpressure so as to either hold the stamp (underpressure) or release the stamp (overpressure). Thus, during the imprint process, by releasing the stamp at one X-Y location (e.g., at an edge), a first contact is made between the relief surface and resist at that location. The stamp is then gradually released from the stamp manipulator to be pulled into the resist layer mostly by capillary forces. The contact thereby grows from the first contact location along the X-axis and/or Y-axis direction depending on the release scheme.

To be able to attach a stamp to the manipulator it needs to be positioned up-side down beneath the manipulator. To do this, the stamp is laid down on a stamp holder (up-side down with the relief surface facing downward). The stamp manipulator is moved over the laid down stamp facing the back side of the glass plate of the stamp after which the glass plate surface of the stamp is adhered to the manipulator by operation of the manipulator openings.

A substrate is then loaded onto the chuck and positioned as desired with respect to the relief layer surface.

To set the imprint gap at the beginning of the process the distance (in the Z-axis direction) needs to be set to a desired value (e.g., in a range of 50 μm to 150 μm) and be kept within tight tolerances (e.g., with a gap variation in a range of 5 μm to 10 μm) during the imprinting process. The imprint gap is the gap between the wafer and the stamp.

During the imprinting step, the manipulator openings are switched from underpressure to slight overpressure to gradually release the stamp from the stamp manipulator such that the feature pattern is pulled into the resist layer by capillary forces, as the spacing between neighboring protrusions of such a pattern typically acts as a capillary, which therefore speeds up the wetting of the stamp by the resist. Upon and after development (e.g., solidification) of the resist layer while in contact with the stamp, the feature pattern of the flexible stamp is released from the resist layer by an opposite process in which individual manipulator openings are switched to an under pressure, thereby gradually releasing the feature pattern from the developed resist layer. The release process is typically hampered by the interaction between the stamp material and the developed (solidified) resist, which slows down the release process. This is due to the enhanced surface area between the stamp and the cured resist, which increases the van der Waals forces per unit area. Thus, it is possible on an imprinting apparatus such as the apparatus disclosed in WO 2008/068701 A2 to set the speed of an imprinting or release step.

In current SCIL imprint machines, a 100 to 200 mm diameter wafer may be used. A single linear Z-stage is used for the vertical movement of the chuck in order to load and unload a wafer and to adjust the imprint gap. An adjustment of the tilt (RX and RY) between the chuck and the groove plate is for example implemented manually with three micrometer adjustment screws.

The height of the stamp landing ring in existing machines is fixed. It can only be adapted by replacing the stamp landing ring with a different height.

There is a desire to scale the design up to enable printing of larger wafers, such as 300 mm wafers. This results in an increase in the required process forces (e.g., twice as high) and a larger span width (e.g., 300 mm diameter instead of 200 mm). To maintain a required imprint gap variation such as 5-10 μm during the process load, it is not possible simply to just scale up existing designs. In particular, the support for the wafer would not have enough stiffness.

The support for the wafer for example comprises a frame of support such as for example a C-frame design of support and a chuck. The support frame may bend, because of the process load or due to warping during heating. Bending or warping results in a larger variation of the imprint gap. This reduces the quality of the imprint process significantly. A larger chuck also has large thermal mass, which results into long heating and cooling times.

US 2005/184436 A1 describes a UV nanoimprint lithography process and its apparatus that is able to repeatedly fabricate nanostructures on a substrate by using a stamp that is as large as or smaller than the substrate in size.

WO 2011/084531 A2 describes mobile vacuum carriers that may be used to support thin substrates that would otherwise be too brittle to transport and process.

SUMMARY OF THE INVENTION

One issue is thus the need to control the imprint gap quite precisely with a larger area wafer support, such as a chuck and groove plate (e.g., 300 mm diameter), while still allowing simple loading of the stamp and wafer. This loading for example requires a longer distance manipulation of the chuck with respect to the groove plate. The inventors have found that with a larger chuck, the existing designs are difficult to manufacture with tolerances enabling sufficient stiffness to ensure imprint gap control over the entire chuck area.

Another issue is to enable precise and stable control of the position of the wafer support (known as the chuck).

Another issue is to ensure uniform process gap between the stamp and the substrate, including at the location of a stamp landing ring around the outer area of the stamp.

The invention aims to address one or more of these issues.

According to the invention, there is provided an imprinting apparatus comprising:
a first carrier for carrying a flexible stamp having an imprinting pattern; and
a second carrier movable relative to the first carrier and configured to carry a substrate having a resist layer, wherein the second carrier comprises a chuck; and
an interface plate over the chuck, wherein the interface plate comprises an array of openings for receiving already-imprinted areas of one side of a substrate while an opposite side of the substrate is to be imprinted, and wherein the chuck comprises a fluid passage arrangement for coupling to the openings of the array.

This imprinting apparatus may be or comprise a substrate conformal imprinting lithography apparatus. The flexible stamp has an imprinting pattern, and the first carrier for example comprises an array of actuators (e.g., manipulator openings or apertures) for use in pulling the flexible stamp towards the first carrier and for use in pushing the flexible stamp away from the first carrier. The array of actuators may be or comprise pressure operated manipulator openings or apertures, but other types can also be used such as for example electric or electromagnetic actuators for example in combination with flexible stamps having a metal support layer.

The disclosure provides for an interface place for use in the imprinting apparatus as disclosed herein, wherein the interface plate comprises an array of openings for receiving already-imprinted areas of one side of a substrate while an opposite side of the substrate is to be imprinted, and wherein the openings are arranged for coupling to a fluid passage arrangement of a chuck of the imprint apparatus when the interface plate is attached to the chuck.

The use of an interface plate allows contact between the chuck and already-imprinted areas of the substrate to be avoided. The structure between the openings can rest against non-imprinted areas, for example the lines along which the substrate will be diced. The interface plate is thus designed to match the particular imprint being performed. It enables more reliable double-sided imprinting.

The interface plate for example comprises columns of openings, wherein at least the different columns connect to different fluid passages. All openings may have their own fluid connection or they may be grouped in columns. The columns mean that the pressure applied can follow a path corresponding to the imprinting process. Thus, a supporting pressure can be provided where the printing bulge is located. The columns are for example perpendicular to a direction in which the imprinting process advances.

The interface plate for example comprises a stainless steel plate. This can be made with a low thickness which allows for low thermal mass and also with the ability to match the contour of the chuck.

The interface plate is, for example, between 0.5 mm and 2 mm thick, for example around 1 mm thick.

The openings in the interface plate may be formed by chemical etching.

The interface plate can have a top surface for receiving the substrate and an opposing bottom surface for attaching to the chuck and the openings extend form the top surface to the bottom surface.

The interface plate may further comprise grooves for connection to fluid passages of the chuck and arranged to be located in between areas of openings 872. The grooves may be configured for receiving underpressure from the fluid passages to hold a wafer at locations without imprinted areas.

The second carrier may comprise a set of chuck actuators each for translating a portion of the chuck in a direction perpendicular to the plane of the second carrier. The chuck actuators enable control of rotation of the chuck about X- and Y-axis (in-plane of the chuck/substrate) as well as in the Z-axis direction. Thus tilt and wedge compensation is enabled, and this can be manual and/or automatic based on local position sensing. Tight control of the imprint gap is enabled.

Each chuck actuator may comprise an actuator output and a lever arrangement between the actuator output and a chuck drive member. The lever arrangement enables an increase in positioning accuracy and increased stiffness, compared to the direct control of position using the actuator output.

The apparatus may further comprise:
a main frame;
a main frame actuator for translating the main frame in a direction perpendicular to the plane of the second carrier, wherein the chuck actuators are for translating a portion of the chuck relative to the main frame and the main frame actuator has a larger stroke than said chuck actuators.

The Z-axis movement (perpendicular to the plane of the chuck/substrate) of the chuck is divided into two stages, with separate long stroke and short stroke drivers. This creates a very stiff support. The chuck actuators enable control of rotation of the chuck about X- and Y-axis (in-plane of the chuck/substrate) as well as in the Z axis direction. Thus, tilt and wedge compensation is enabled, and this can be manual and/or automatic based on local position sensing. Tight control of the imprint gap is enabled.

The main frame actuator has a large stroke (e.g., 50 mm or larger) to facilitate loading of the stamp and substrate and the chuck actuators have a small stroke for fine adjustment, e.g., to +/−1 µm with a stroke of e.g., 5 mm.

The second carrier may further comprise a sub-frame, wherein the sub-frame is connected to the main frame and the chuck is mounted to the sub-frame, wherein the sub-frame is mounted to the main frame by a spring arrangement for biasing the sub-frame against the first carrier through a kinematic coupling during imprinting.

The chuck is then carried by a stiff sub-frame. This sub-frame can then be decoupled from the main frame and the main frame actuator. The spring arrangement provides decoupling between the sub-frame and the main frame. The sub-frame behaves as a rigid body, and deformation of the main frame and/or the main actuator will not influence the imprint gap. In particular, a separation of the force path and the position path is implemented.

The chuck may comprise a hollow cylindrical body having a top face and a bottom face. A lattice arrangement may be provided between the top and bottom faces.

The design of the chuck avoids deformation even when a large dimension chuck is used, for example, for carrying a 300 mm diameter substrate. The chuck has a reduced thermal mass while maintaining the required stiffness for maintaining a uniform imprint gap.

The flexible stamp has an imprinting pattern, and the first carrier, for example comprises an array of actuators (e.g., apertures) for use in pulling the flexible stamp towards the first carrier and for use in in pushing the flexible stamp away from the carrier.

The top and bottom faces for example each comprise an internal water channel arrangement for providing a flow path between a set of water inlets and a water outlet. Heating and cooling is provided at the top and bottom surfaces of the chuck rather than throughout the structure, giving effective heat control. The heating and cooling at the top and bottom surfaces prevents buckling. Since, in comparison with a solid chuck, less mass needs to be cooled and heated, also or alternatively a higher heating/cooling rate may be achieved.

The set of water inlets is for example arranged around a periphery of the chuck and the water outlet is arranged in the center of the chuck. The heating or cooling water thus flows from a periphery of the surfaces to the center, thereby covering the full area of the chuck, at both the top and bottom surfaces. A more uniform heating may be achieved.

The chuck may comprise a set of ducts extending between the top and bottom faces, with ducts between the water inlets of the top face and corresponding water inlets of the bottom face, and with a duct between the water outlet of the top face and the water outlet of the bottom face, wherein the ducts each comprise a stress reduction feature.

This avoids the fluid paths through the chuck causing deformation of the overall chuck shape by internally distributing thermal stresses.

The apparatus may further comprise a stamp landing ring (or more generally a stamp landing device) around an outside of the chuck, wherein the stamp landing ring is for facing the first carrier outside the area of the flexible stamp. The stamp landing ring provides a support for a substrate of the flexible stamp. The flexible stamp for example comprises a glass substrate and a rubber stamp area over a central area of the glass substrate. The stamp landing ring enables the same process gap to be present over the flexible stamp, even though it has regions of two different heights.

The second carrier may comprise a set of position sensors for measuring a distance from the stamp landing ring to the first carrier. These position sensors enable a position of the stamp landing ring to be controlled, for example to take account of different stamp thicknesses, and hence different height profiles of the flexible stamp.

The apparatus may further comprise a set of landing ring actuators, each with a third stroke, smaller than the first stroke, for translating a portion of the stamp landing ring relative to the main frame in a direction perpendicular to the plane of the second carrier. Thus, actuators for moving the stamp landing ring may also be integrated into the second carrier.

The invention also provides a chuck for use in the imprinting apparatus defined above, wherein the chuck comprises a hollow cylindrical body having a top face and a bottom face and a lattice arrangement between the top and bottom faces.

BRIEF DESCRIPTION OF THE DRAWINGS

Embodiments of the invention are described in more detail and by way of non-limiting examples with reference to the accompanying schematic drawings, wherein.

DETAILED DESCRIPTION OF THE EMBODIMENTS

Figure 1:
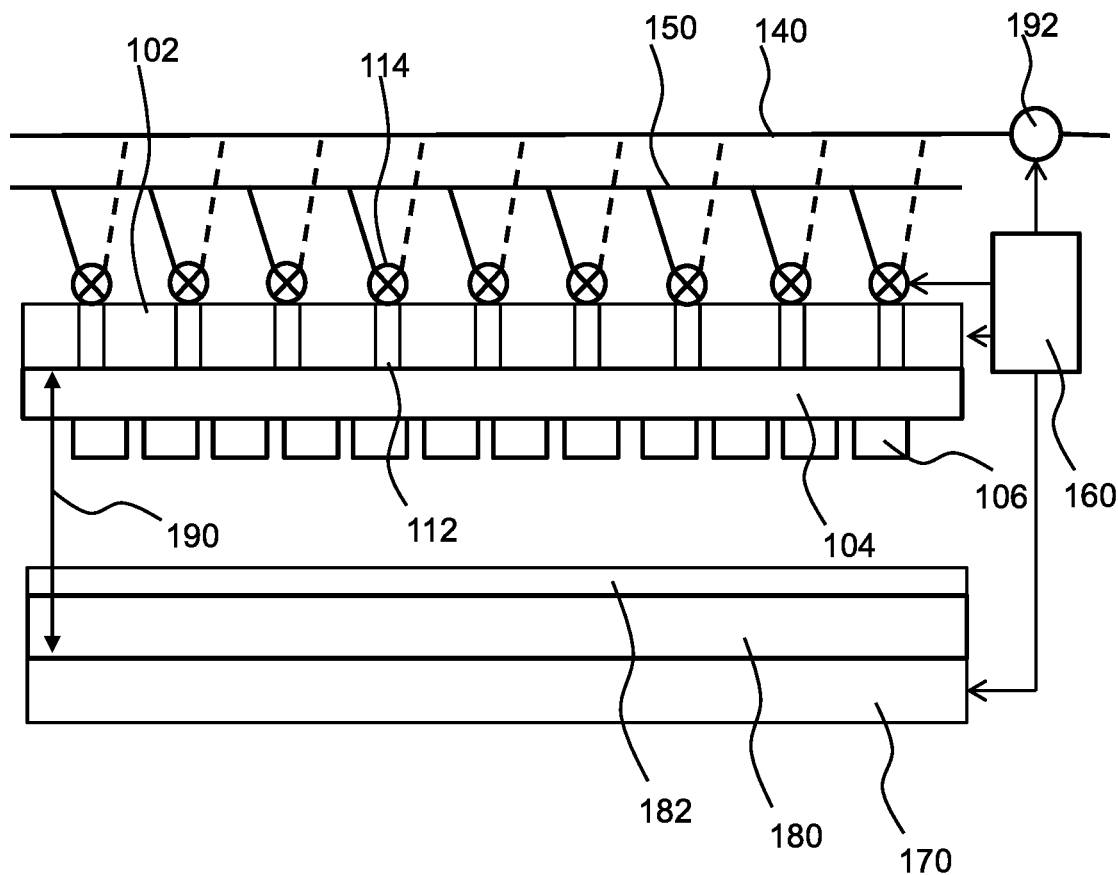
FIG. 1 depicts an imprinting apparatus.

The figures are not drawn to scale. The he same reference numerals are used throughout the figures to indicate the same or similar parts.

The invention provides an imprinting apparatus which comprises a first carrier for carrying a flexible stamp having an imprinting pattern and a second carrier movable relative to the first carrier and configured to carry a substrate having a resist layer. The second carrier comprises a chuck and an interface plate over the chuck, wherein the interface plate comprises an array of openings for receiving already-imprinted areas of one side of a substrate while an opposite side of the substrate is to be imprinted. The chuck comprises a fluid passage arrangement for coupling to the openings of the array. The use of an interface plate allows contact between the chuck and already-imprinted areas of the substrate to be avoided. The interface plate enables more reliable double-sided imprinting.

Before describing the invention, the apparatus and method disclosed in EP 3126909A and WO 2020/0099265 will first be described with reference to FIGS. 1 to 4, and then a modification of this apparatus embodying the invention will be described.

FIG. 1 depicts an imprinting apparatus 100. The imprinting apparatus 100 may be a SCIL imprinting apparatus or any other suitable imprinting apparatus that can be used to transfer an imprinting pattern from a (flexible) stamp to a substrate.

The imprinting apparatus 100 typically comprises a first holder (e.g., a groove plate) as part of a first carrier 102 for holding a flexible stamp 104 including an imprinting pattern defined by recesses between protrusions 106. The first holder is mounted in a frame (not shown) both being part of the first carrier. The flexible stamp 104 and imprinting pattern 106 may be realized in any suitable material e.g., a suitable (synthetic) rubber material such as a polysiloxane-based material, e.g., polydimethylsiloxane (PDMS). The rubber layer may be applied to a flexible stamp plate (not separately shown and made of e.g., glass, plastic or metal). The feature size of the imprinting pattern may be any suitable size, and preferably is a micrometer scale or nanometer scale pattern, that is, a pattern having feature sizes as low as 10 nm up to in excess of 1 mm, with an aspect ratio (vertical dimensions divided by lateral dimensions) of the features may be 8 or higher. It should however be understood that other feature sizes may also be contemplated, and that the present invention equally may be applied to transfer patterns having smaller aspect ratios. For example, at least some embodiments of the present invention are suitable to transfer imprinting patterns with an aspect ratio in the range of 0.001 to 10.

Figure 2:
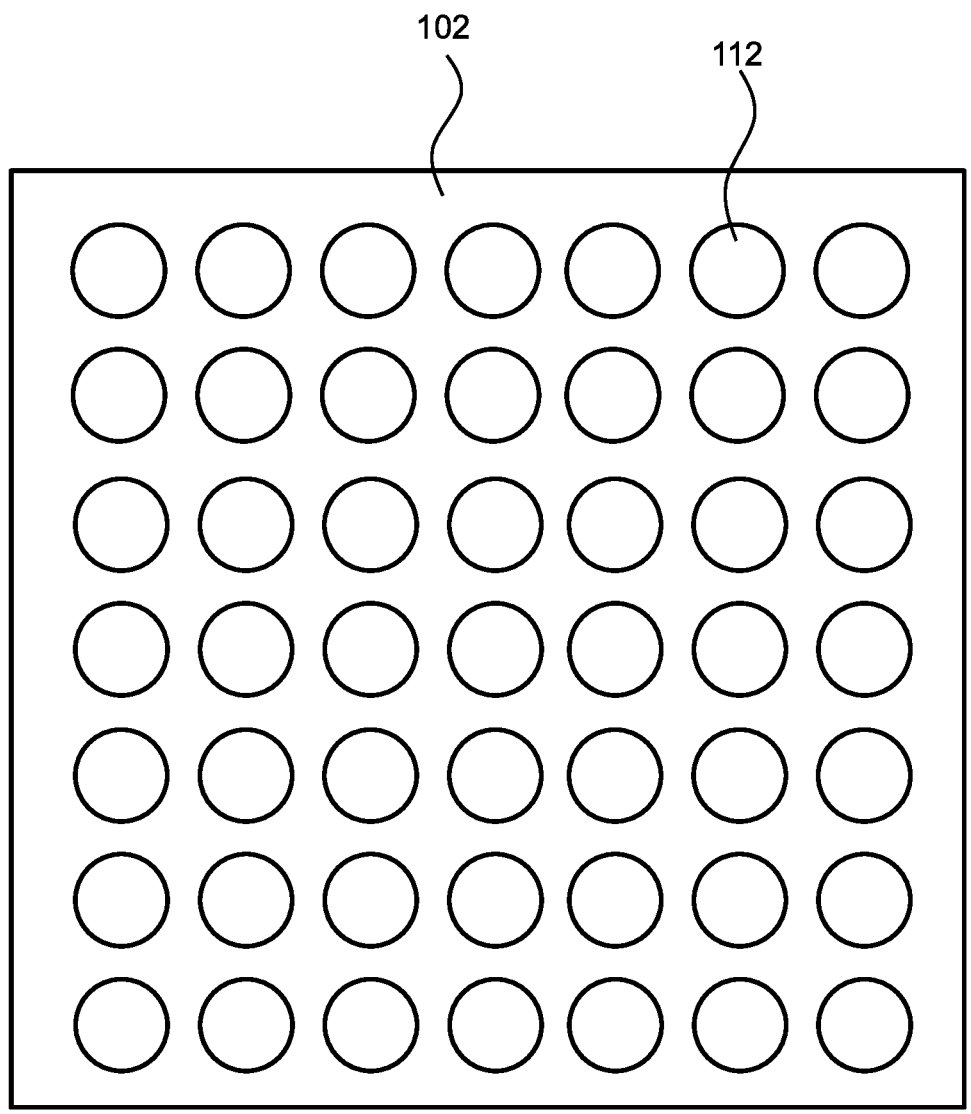
FIG. 2 depicts an example of part of the imprinting apparatus of FIG. 1.

To this end, the first carrier 102 typically comprises a plurality of stamp engaging elements 112, which may be arranged in an array or grid (see for example FIG. 2). Such stamp engaging elements 112 are typically arranged to pull a portion of the flexible stamp 106 towards the first carrier 102 in a first configuration and to push the portion of the flexible stamp then away from the first carrier 102 in a second configuration. Such elements may be referred to a stamp actuators. In the following detailed description, the stamp engaging elements 112 are embodied by apertures that can be switched between an underpressure (vacuum) and an overpressure in order to provide the first and second configuration is respectively. Other actuators may be used such, as for example electromagnetic actuators.

The apertures 112 may have any suitable shape. For example, the apertures 112 may be groove-shaped, with the grooves extending over substantially the whole length of the first carrier 102; or the apertures 112 may be circle-shaped; or the apertures 112 defining a two-dimensional grid, as shown in FIG. 2. Other suitable shapes will be apparent to the skilled person. Groove-shaped apertures 112 are for example suitable in case the imprinting direction and the release direction of the flexible stamp are the same or opposite to each other. The two-dimensional grid of circular apertures 112 as shown in FIG. 2, for example, is particularly suitable in case the imprinting direction and the release direction of the flexible stamp 104 are different from each other, as will be explained in more detail later.

Each aperture 112 comprises a valve 114 that can switch the aperture 112 between an overpressure source provided via the first channel 140 (referred to as "overpressure channel") and an underpressure source, e.g., vacuum pump or reservoir of air at low pressure, provided via second channel 150 (from here on referred to as the underpressure channel). The connection between each valve 114 and the underpressure channel 150 is shown by solid lines and the connection between each valve 114 and the overpressure channel 140 is shown by dashed lines. The underpressure may be supplied at about 500 mBar to 900 mBar below ambient, more preferably at about 0.7 to 0.8 Bar below ambient, i.e., at about 200-300 mBar absolute.

The respective valves 114 are typically controlled by a processing element (e.g., a processor) 160, which may take any suitable shape or form. The processing element 160 typically executes computer program code that instructs the processing element 160 on how to control the valves 114 and the first carrier 102 during the imprinting process, as will be explained in more detail later.

The flexible stamp 104 may be affixed to the first carrier 102 by switching the apertures 112 to an underpressure. Additional affixing means may be provided, for example around an edge portion of the flexible stamp 104. Such affixing means may for example comprise clamps clamping the edge of the flexible stamp 104 to the first carrier 102 although at least some examples no additional affixing means are being used.

The imprinting apparatus 100 further comprises a second holder (also referred to as second carrier) 170 for carrying a substrate 180 to be imprinted.

The second carrier 170 for example comprises an aluminum or stainless steel chuck. The chuck is actuated for coarse alignment using micrometer spindles. The chuck is surrounded by a plate which functions as a stamp landing device or ring which functions as will be described herein below. The device may be made of aluminium, stainless steel or other solid material.

Water channels inside the chuck are used for heating and cooling of the chuck, for controlling heat based curing of the resist layer.

Any suitable substrate 180 may be used, e.g., any suitable semiconductor substrate such as a silicon substrate, a silicon-on-insulator substrate, a silicon germanium substrate. To this end, the substrate 180 may carry a resist layer 182, which may be any suitable material. For example, the resist layer 182 may comprise a curable material that may be solidified (cured) to immobilize the imprinting pattern 106 in the resist layer 182. In an example, the resist layer 182 comprises a sol-gel material. A suitable example of such a material is disclosed in WO 2009/141774 A1, although it should be understood that any suitable resist material may be used. Further examples of suitable resist materials for example can be found in US 2004/0261981 A1, WO 2005/101466 A2, US 2005/0230882 A1, US 2004/0264019 as well as in the non-patent publication Advanced Materials, 1998, Vol. 10(8), page 571.

The first carrier 102 is controlled by the processing element 160. To this end, the imprinting apparatus 100 further comprises means for positioning and repositioning the first carrier 102 relative to the second carrier 170 including in three dimensions represented by the three Cartesian coordinates X, Y, Z under control of the processing element 160. Furthermore, there may be provided means for adjusting the relative positions laterally (in a direction parallel to the second carrier 170), vertically (in a direction perpendicular to the second carrier 170) both using translation and orientation. In this example the apparatus includes automated displacement means under control of the processing element 160. The automated displacement means may include for example mechanical or electrical units providing mechanical or electrical feedback mechanisms for precisely controlling the relative XYZ positions and orientation of the first carrier 102 relative to the second carrier 170. Such displacement means are known per se and are therefore not described in any further detail for the sake of brevity only.

The second carrier 170) optionally may also be controlled by the processing element 160 in a manner analogous to the above control means for the first carrier 102, to increase the degrees of freedom of the imprinting apparatus 100. However, it is equally feasible to provide an imprinting apparatus 100 having a stationary or fixed second carrier 170.

The first carrier 102 is separated from the second carrier 170 by a gap 190, the size of which may be controlled by the processing element 160, e.g., by engaging the means for positioning and repositioning the first carrier 102 relative to the second carrier 170. In a particular example, the processing element 160 may be programmed to alter the gap size in between the imprinting step and the release step. Specifically, the processing element 160 may be programmed to increase the gap size upon completion of the imprinting step (and after developing the resist layer 182) as increasing the gap size can aid the release of the imprinting pattern 106 from the developed resist layer 182.

The overpressure channel 140 may include a pressure regulator 192 under control of the processing element 160. This facilitates varying the overpressure during an imprinting or release step.

The imprinting apparatus 100 may have a user interface, e.g., a user terminal including at least one instructions input device such as a keyboard, mouse, trackball, and so on for allowing the user to configure the imprinting apparatus 100 in accordance with the desired imprinting process. It should be understood that any suitable user interface may be used.

As mentioned above, the processing element 160 is arranged to control the first carrier 102, the valves 114 and/or the pressure regulator 142. To this end, the imprinting apparatus 100 further comprises a computer-readable data storage medium (not shown), such as a memory device, e.g., Flash memory, RAM or ROM, a solid state disk, a magnetic disk and so on. The data storage medium comprises computer program code for execution by the processing element 160, which computer program code causes the processing element 160 to implement the various steps of the imprinting method. The data storage medium may be located in any suitable location of the imprinting apparatus 100. The he data storage medium may be integral to the processing element 160 or may be a discrete component accessible by the processing element 160 in any suitable manner, e.g., over a data communication bus or a point-to-point connection between the processing element 160 and the data storage medium.

A typical imprinting process using the imprinting apparatus 100 is as follows. A flexible stamp 104 comprising an imprinting pattern 106 is affixed to the first carrier 102, for example by switching the valves 114 such that the apertures 112 are connected to an underpressure channel 150, which channel may be connected to an underpressure-providing source such as a vacuum pump. The first carrier 102 is subsequently positioned over the second carrier 170 carrying the substrate 180 coated with resist layer 182, such that the imprinting pattern 106 faces the resist layer 182. The first carrier 102 is typically positioned relative to the second carrier 170 such that a gap 190 exists between the first carrier 102 and the second carrier 170, which gap 190 may be defined by the user of the imprinting apparatus 100 to ensure a good conformal contact between the flexible stamp 104 and the substrate 180 during imprinting. The gap 190 may be chosen in any suitable range; for example, in a typical SCIL process in which the imprinting pattern 106 is a nanoscale pattern, the gap 190 may be chosen in a range from 10-500 μm, preferably in a range from 20-200 μm, more preferably in the range from 10-100 μm.

Upon positioning the first carrier 102 relative to the second carrier 170, the imprinting process proceeds with an imprinting step, in which a contact area is created between the flexible stamp 104 and the substrate 180, which contact area is gradually expanded until the entire imprinting pattern 106 intended to contact the substrate 180 is brought into contact with this substrate.

Figure 3:
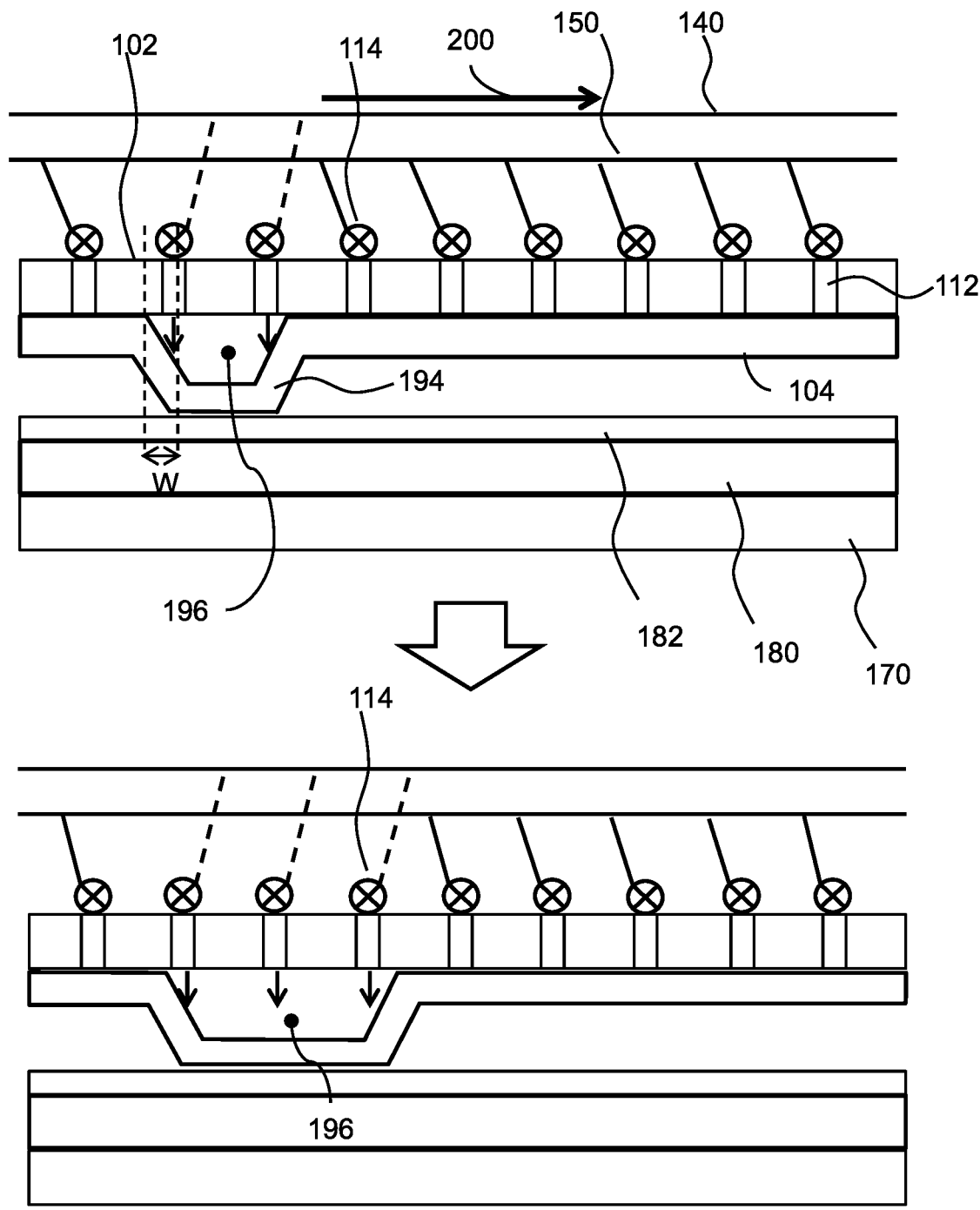
FIG. 3 depicts an imprinting cycle using the imprinting apparatus of FIG. 1.

FIG. 3 shows the imprinting process. In FIG. 3 the imprinting pattern 106 has been omitted for the sake of clarity only.

As can be seen in the upper pane of FIG. 3, an initial contact area 194 is created between the flexible stamp 104 and the substrate 180 by individually switching selected apertures 112 from underpressure to overpressure in the direction of the horizontal arrow 200 over the overpressure channel 140. In FIG. 3, only the selected connections between the valves 114 and the respective channels 140 and 150 are shown, for reasons of clarity. This bulges part of the flexible stamp 104 away from the first carrier 102 towards the second carrier 170 in order to establish the contact area 194 between the flexible stamp 104 and the second carrier 170 including the substrate 180 carrying the resist layer 182. A space 196 is formed between the first carrier 102 and the flexible stamp 104.

The contact area 194 is typically expanded by moving the contact front of the contact area 194 in the direction of the aforementioned arrow by periodically switching the next aperture 112 from the underpressure to the overpressure by controlling its valve 114, as shown in the bottom pane of FIG. 3. This process is repeated until the contact area 194 is established over the entire desired area of the substrate 180, i.e., the desired portion of the imprinting pattern 106 has been brought into contact with the resist layer 182. The rate of expansion of the contact area 194 is typically determined by the rate at which the next apertures 112 are switched to the overpressure, as well as by the gap 190. The associated bridge width W where the stamp is not contacted by either the first carrier 102 or the substrate 180 may for example be chosen between 10 mm and 50 mm.

Once the desired contact area 194 between the imprinting pattern 106 and the substrate 180 has been established, the resist layer 182 is subsequently developed, e.g., cured, in any suitable manner, for example by exposure to an external stimulus such as UV or visible light, heat and so on. This solidifies the resist layer 182, which immobilizes the imprinting pattern 106 in the developed resist layer 182.

At this stage, the gap 190 may be adjusted, i.e., increased, in order to reduce the duration of the release step in which the imprinting pattern 106 is released from the developed resist layer 182. Not all gap settings facilitate automatic release of the stamp. Depending on the type of imprinting pattern 106 and resist layer 182, the stamp 104 can be attached to the imprinted developed resist layer 182 by a relatively high contact area 194, and thus force. The release force that can be generated is higher for larger gaps 190. For example, it is possible that a stamp 104 cannot be released from the developed resist layer 182 if the gap 190 is set to 50 micron, but can be released if this gap is 100 micron.

Figure 4:
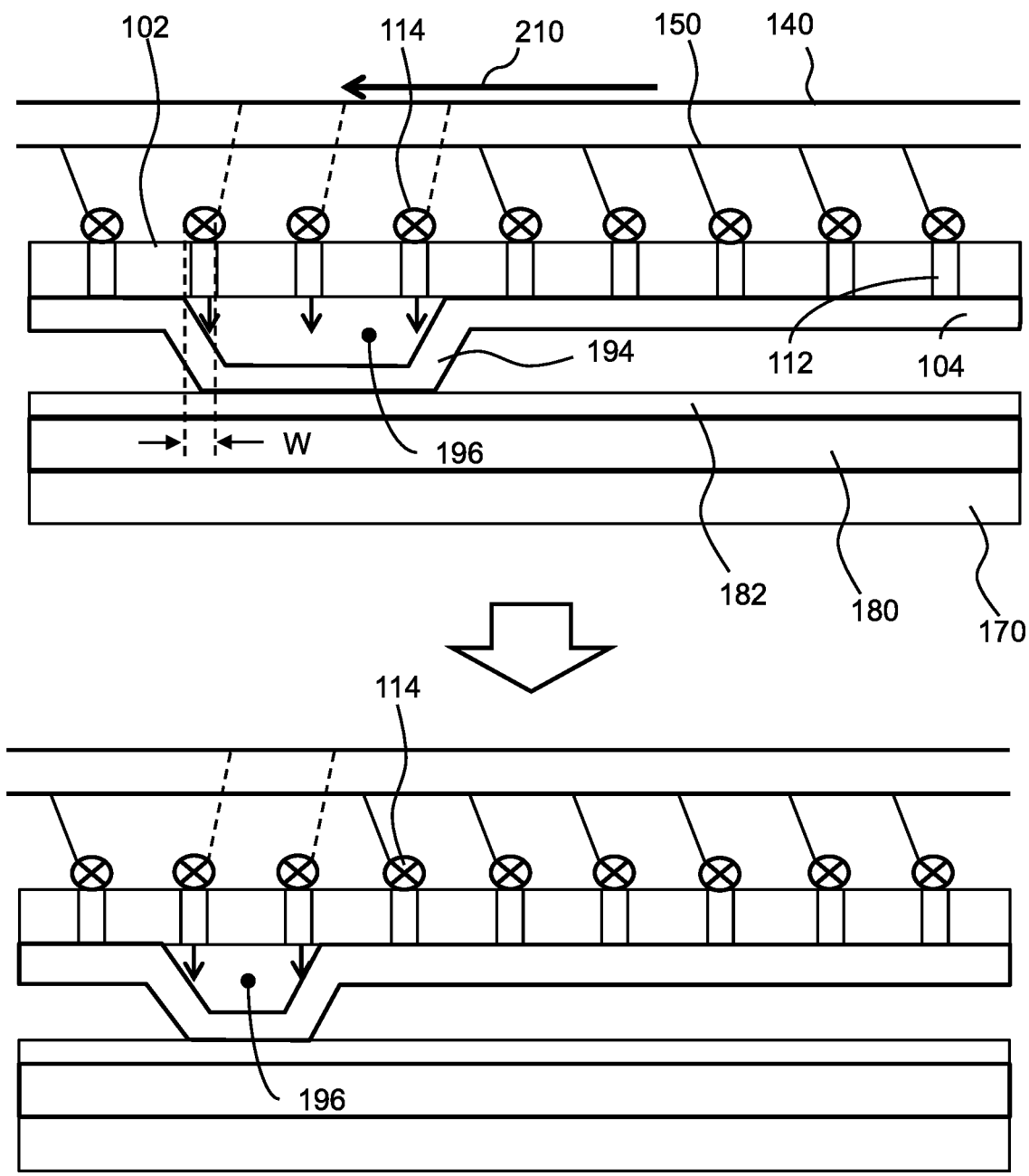
FIG. 4 depicts a release cycle using the imprinting apparatus of FIG. 1.

FIG. 4 is used to show how the stamp is released. During the release step, individual apertures 112 are switched from overpressure channel 140 to underpressure channel (vacuum) 150 by the processing element 160 controlling the respective valves 114, which causes the flexible stamp 104 to move up, i.e., the flexible stamp 104 is peeled away from the developed resist layer 182, thereby sealing the vacuum and shortening the bridge length W by one aperture pitch. This increases the force on the contact surface 194 and as more apertures 112 are switched to underpressure to displace the contact front of the contact area 194 in the direction of the horizontal arrow 210, as shown in the bottom pane of FIG. 4, the bridge is further shortened. The bridge is shortened until the force is equal to the release force of the imprinting pattern 106 of the flexible stamp 104 from the developed resist layer 182 on the substrate 180 carried by the second carrier 170. This then relaxes by release of the stamp. With a larger gap 190, the forces normal to the substrate wafer are higher, thereby easing the stamp release. Also, the longer bridge length caused by this larger gap 190 allows more force to be applied before the vacuum seal is lost between the portion of the stamp 104 and the apertures 112 of the first carrier 102 holding the flexible stamp 104 in place, e.g., the apertures 112 in contact with the outer edge of the flexible stamp 104.

It is noted that during stamp release from the solidified resist layer, the flexible stamp 104 is in equilibrium with the force required to release the stamp. The next aperture 112 can only be switched to underpressure, e.g., vacuum, after a portion of the flexible stamp 104 (on average) has released that has a size comparable to an aperture-to-aperture distance. Consequently, the rate of release of the flexible stamp 104 from the substrate 180 will be determined by the gap setting as well. For the example, if a flexible stamp 104 can be released using a gap of 50 and 100 microns, the release speed for a gap of 100 micron will be higher than that of a 50 micron gap, such that a higher release rate, i.e., the rate at which individual apertures 112 are switched to the underpressure along the direction indicated by the horizontal line, can be applied by the processing element 160, i.e., by periodically switching the corresponding valves 114 to the underpressure channel 150. For the highest throughput of the overall imprinting process, the gap 190 setting for the imprinting step may be different from the gap 190 required for optimal stamp release during the release step shown in FIG. 4.

Further details of the known printing process are disclosed in EP 3126909A and WO2020/0099265.

As mentioned above, there is a desire to scale the design up to enable printing of larger wafers, such as 300 mm wafers. This results in an increase in the required process forces (e.g., twice as high) and a larger span width (e.g., 300 mm diameter instead of 200 mm). To maintain a required imprint gap variation such as 5-10 µm during the process load, it is not possible simply to scale up existing designs. In particular the second carrier 170 (which comprises a chuck and a supporting chuck frame) would not have sufficient stiffness.

In particular, a conventional C-frame design implemented by the coupling between the chuck frame and the groove plate will bend, because of the process load. Bending results in a larger variation of the imprint gap. This reduces the quality of the imprint process significantly.

The chuck frame can also warp during heating. While some warping is permitted to a small extent, after cooling down to room temperature warping is not accepted.

The chuck frame also has a large thermal mass, which results in long heating and cooling times. A thermal temperature gradient across the chuck can also be too high when the size is scaled up.

There is a need to control the imprint gap with a larger area chuck and groove plate (e.g., 300 mm diameter) while still allowing simple loading of the stamp and wafer. This for example requires a longer distance manipulation of the chuck with respect to the groove plate (i.e., the first carrier 102). With a larger chuck, the existing designs are difficult to manufacture with tolerances enabling sufficient stiffness to ensure gap control over the entire chuck area.

A first aspect of the invention relates to the chuck manipulator.

Figure 5:
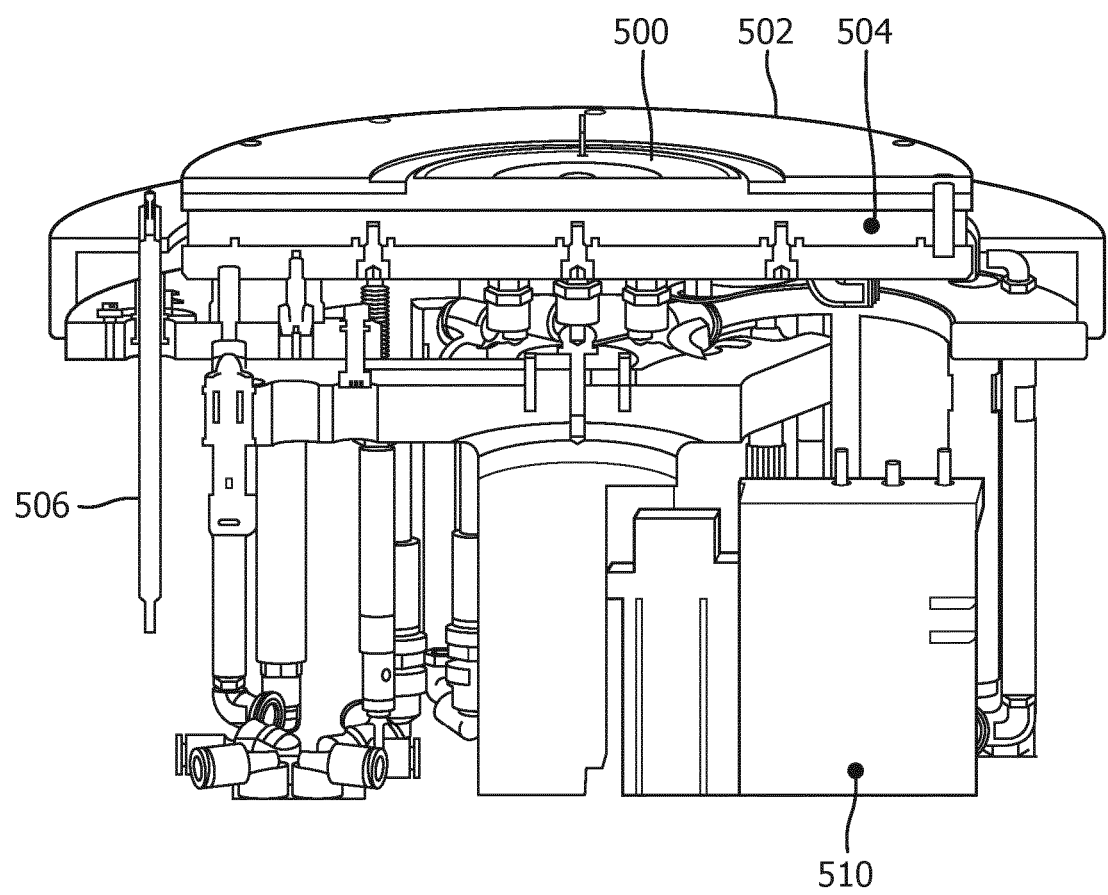
FIG. 5 shows a design of a chuck manipulator.

FIG. 5 shows the design of the chuck manipulator.

It shows the chuck 500 surrounded by a stamp landing ring 502. The chuck 500 comprises a chuck frame 504. The position of the chuck frame is adjustable by micrometer adjustment screws 506.

The Z-axis position control of the chuck is controlled by a single Z-stage actuator 510.

This first aspect of the invention provides a two-component frame chuck manipulator.

Figure 6:
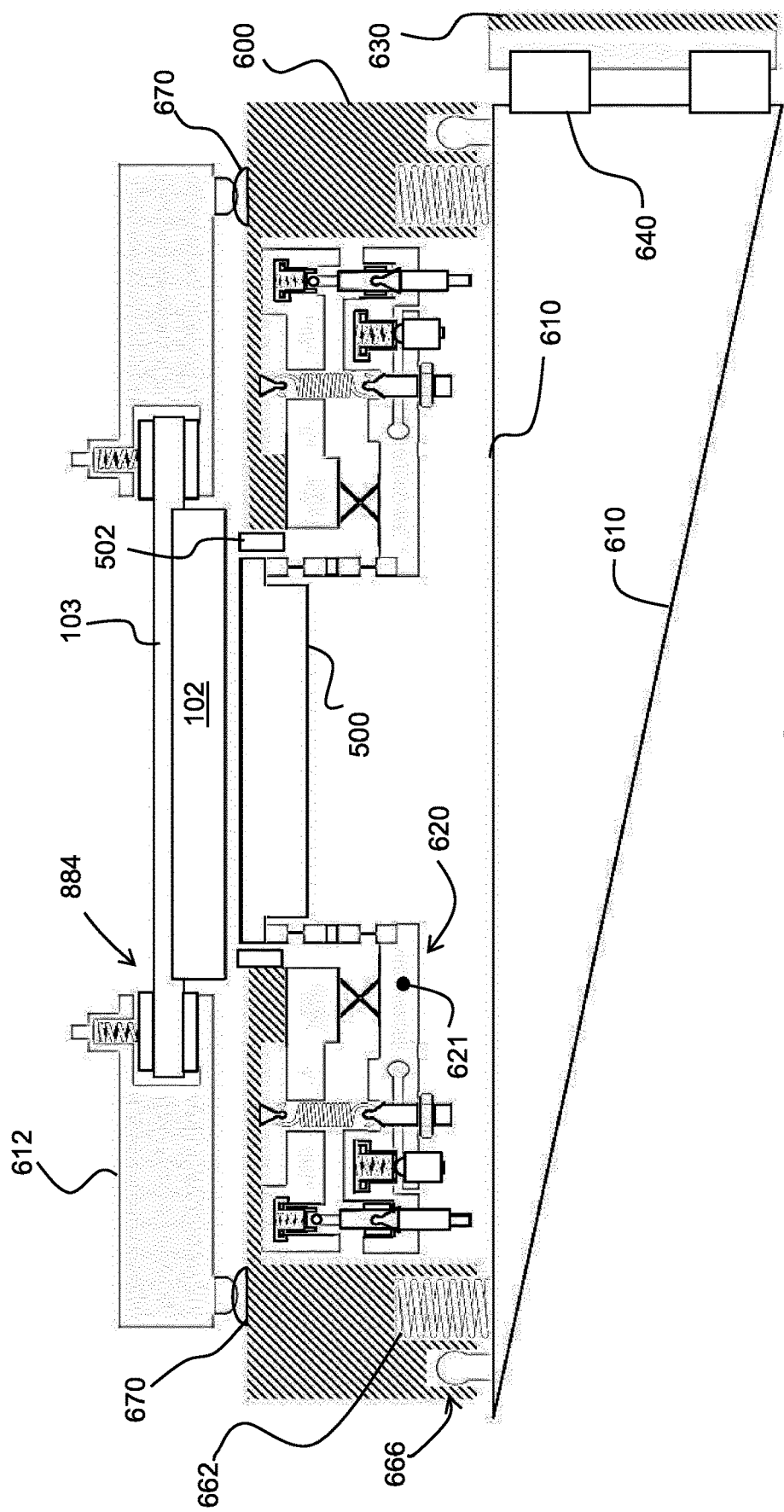
FIG. 6 shows an imprinting apparatus incorporating various design features.

FIG. 6 shows the overall system, comprising a sub-frame 600 on which the chuck 500 and stamp landing ring 502 is mounted. The chuck 500 is held by the sub-frame 600 and is manipulated relative to this sub-frame 600 using a set of three short stroke manipulators 620, discussed in further below. The three short stroke manipulators 620 (i.e., sometimes also referred to as "chuck actuators") are spaced angularly around the chuck 500.

The sub-frame 600 may be considered to be the main structural part of the second carrier and hence may be considered to be equivalent to the support 170 in FIG. 1.

The chuck is design to hold either a 200 mm wafer or a 300 mm wafer in this example. The chuck for example has a spillage channel around the outside of a 200 mm diameter and another spillage channel around the outside of a 300 mm diameter.

The sub-frame 600 may be a bolted assembly, but it could also be a welded or a 3D-printed construction. The sub-frame 600, including the chuck, is manipulated as a subassembly mounted to a main frame 610. The main frame 610 is manipulated relative to the fixed world, i.e., a reference frame 630, using a long stroke driver 640 (i.e., sometimes also referred to as "main actuator"). The manipulation using the main actuator 640 allows long distance chuck manipulation (e.g., 50 mm or larger, for example between 50 mm and 250 mm) for loading of the stamp and/or wafer or servicing of parts of the chuck. In addition, the main actuator 640 stiffly fixes (i.e., presses) the sub-frame 600 to the groove plate (i.e., as part of the first carrier 102), in particular against a grove plate holder 612 that holds the groove plate 102 (and the frame 103), so that the chuck may be short-stroke manipulated relative to the groove plate 102 to control the imprint gap. The short stroke may be around 5 mm or less such as for example 50 µm or less.

At the same time, the sub-assembly of the sub-frame 600 and chuck 500 is biased towards the groove plate via a buffer spring arrangement 662, discussed below. This allows design imperfections of parts that lead to errors in relative orientation of the sub-frame 600 with respect to the groove plate. Errors that originate from movement can also be compensated.

FIG. 6 shows that the sub-frame 600 has a set of contact buffers 670 through which the sub-frame 600 is pressed against a groove plate holder 612. These are discussed further below. The three chuck actuators 620 are also discussed in greater detail below. They are located at corners of a triangle (preferably an equilateral triangle), and a triangular frame defines the sub-frame 600 which supports the chuck 500. The chuck actuators each include a lever arrangement 621 which is discussed below.

The three independent actuators and associated lever arrangements inside the sub-frame 600 support the chuck. In this way, the imprint gap is automatically adjustable in the Z-axis direction as well as for rotation about the X-axis (RX) and Y-axis (RY) directions (e.g., to +/−1 μm). As will be shown below, the support for the chuck is formed using flexure mechanisms which are free of play and friction.

There are also three independent actuators and levers inside the sub-frame for supporting the stamp landing ring (i.e., landing ring actuators). They are for translating a portion of the stamp landing ring in the Z axis direction.

The position of the stamp landing ring relative to the chuck is thus also automatically adjustable in Z-axis direction as well for rotation about the X-axis and Y-axis directions (to +/−1 μm). This enables adjustment to the thickness of the stamp, and/or any taper in the stamp thickness, since the stamp landing ring is contacted by the glass carrier plate of the stamp.

The setup described above in the figure allows for tight control of the imprint gap and associated wedge orientation of the stamp surface with respect to the chuck surface while loading long stroke manipulation of the chuck is still possible.

Note that in-plane (XY) alignment of stamp surface with respect to chuck surface, namely translation in X-axis and or Y-axis direction and/or Z-axis rotation of the stamp surface with respect to the chuck surface, is implemented via manipulation of the groove plate 102 with respect to its holder 612. The groove plate 102 has a groove plate frame 103 which is driven by three linear actuators (shown further below) and the groove plate frame is supported by the groove plate holder 621 by air bearings 884. This is described further below. The groove plate alignment is separate from the gap (Z-axis direction) alignment.

The use of separate long stroke (main) and short stroke (chuck) actuators creates a very stiff support for the chuck in the Z-axis direction.

Three distance sensors are used to measure (and to calibrate) the distance between the top of the chuck and the glass plate of the stamp, i.e., the groove plate. Three distance (and hence position) sensors are also used to measure (and to calibrate) the distance between the top of the stamp landing ring and the glass plate of the stamp. These sensors enable automated control of the chuck actuators and the landing ring actuators, instead of requiring manual adjustment.

Figure 7:
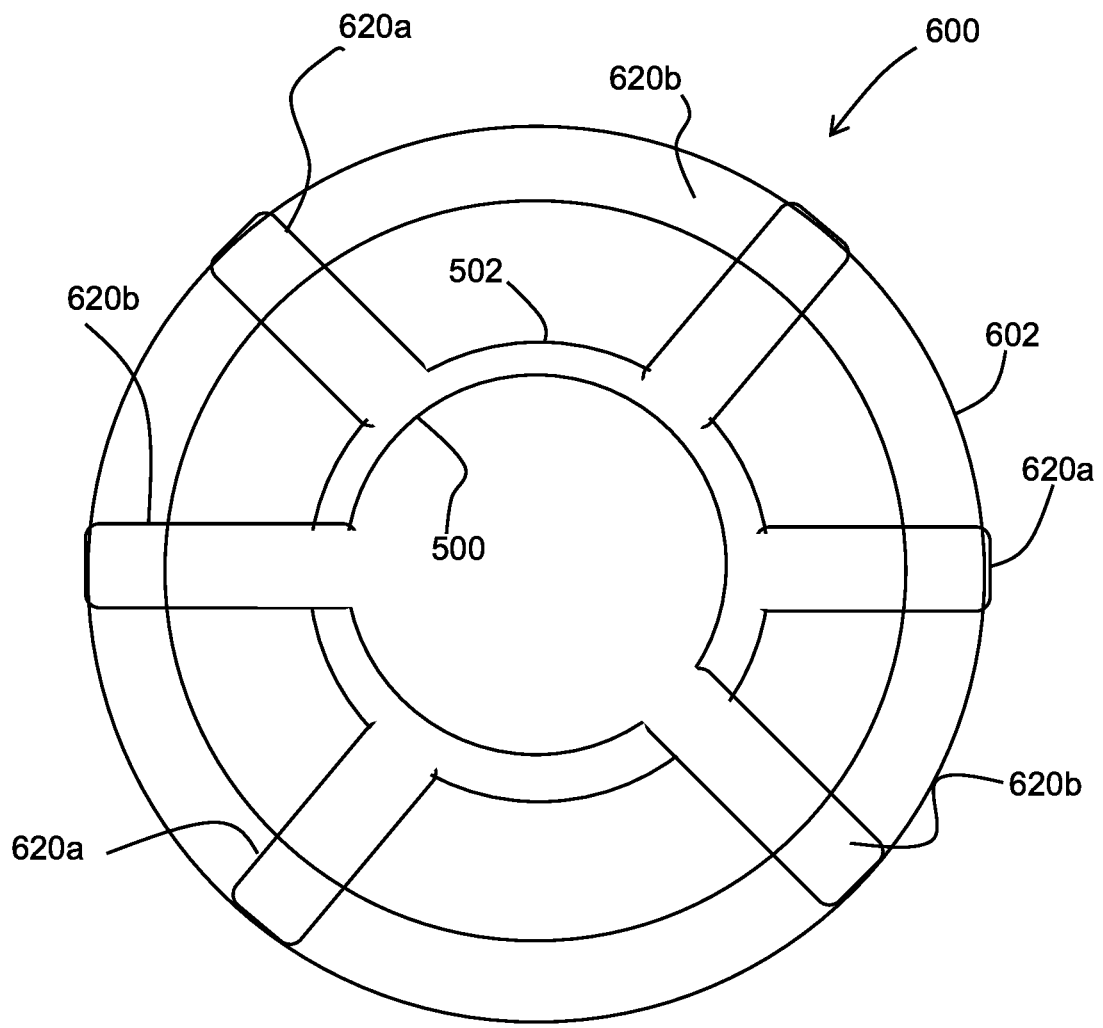
FIG. 7 shows the sub-frame (mounted on the main frame) in plan view.

FIG. 7 shows a plan view of the sub-frame 600.

The sub-frame 600 behaves as a rigid body, which deals internally with the process forces. The sub-frame 600 is a structure which extends around the chuck, such as a ring 602, although it may be a polygon.

The sub-frame 600 is stiff and holds the chuck 500 and the stamp landing ring 502. Landing ring actuators 620a are between the stamp landing ring 502 and the sub-frame 600 and chuck actuators 620b are between the chuck and the sub-frame 600. The actuators can independently translate three edges of the chuck/stamp landing ring in the Z-axis direction (e.g., perpendicular to the chuck top surface) relative to the sub-frame 600. These allow for the ultimate gap control over the entire chuck area and over the stamp landing ring 502.

Fixations are also used for ensuring the thermal centers of the chuck and the sub-frame 600 stay in position during homogeneous explanation. The fixations define the coupling between the chuck and the sub-frame 600. They have sufficient play to allow differential thermal expansion between the two parts, but once the kinematic coupling discussed above is formed, this play does not allow any relative movement.

Returning to FIG. 6, the sub frame 600 is attached to (in this case rests on) the main frame 610. The main frame 610 is slidably supported on the reference frame 630 (the outside world). The main actuator 640 is between the main frame 610 and the reference frame 630 to manipulate the main frame 630 (and also the sub-frame 600 and chuck) with respect to the reference frame 630.

The groove plate holder 612 and the groove plate 102 are also attached to the reference frame 630.

The attachment of the sub-frame 600 to the main frame 610 is spring buffered at three locations. Two spring arrangements 662 are shown in FIG. 6. Although not shown, the spring arrangements 662 may comprise an outer, larger diameter, buffer spring and an inner smaller diameter buffer spring (not visible). The buffer springs serve to compensate for alignment errors while providing a pressing force. They create a rigid coupling between the sub-frame 600 and the groove plate 102.

As mentioned above, the sub-frame 600 has three (spherical top half with circular base) contact buffers 670 at its top surface (opposite to the side resting on the main frame 610). The contact buffers are spherical with a circular base These contact buffers are for pressing the sub-frame 600 against the groove plate holder (at a kinematic coupling location) when the imprint machine is in the imprinting stage.

The buffers 670 are disconnected when loading wafers or stamps as then the sub-frame 600 is lowered from the groove plate by manipulation of the main frame 610 using the main actuator 640. The pressing is so stiff that the groove plate holder and sub-frame 600 effectively have become one stiff part. The spring-loaded connectors 662 between the sub-frame 600 and the main frame 610 ensure that any alignment errors (with any cause) between the groove plate and the sub-frame 600 are compensated for, by these connections. The spring arrangements 662 push the sub-frame 600 against the groove plate holder.

In this way, the gap control is independent of instabilities in the main frame 610 and the reference frame 630 as the gap control is only dependent on the ensemble of the groove plate and sub-frame 600, which functions as a single part.

The kinematic coupling between the sub-frame 600 and the groove plate holder may instead be based on balls and grooves, instead of projections with flat surfaces.

The sub-frame 600 is mounted to the main frame 610 by three pins and three slots in region 666.

The slots are oriented at 0°, 120° and 240° angles. The pins and slots have play of a few micrometers. However, this play will not cause any movements during the imprint process, because of the high friction forces within the kinematic coupling provided by the buffers 670. The forces that the alignment motors can produce are much lower than the friction within the kinematic coupling.

As mentioned above, each of the spring arrangements 662 has a smaller diameter inner spring 664 within each of the larger diameter springs 662 for automatic mechanical overload protection. The two-spring design is optional. During normal processing, the main actuator (long stroke driver) runs at high speed. The impact of a collision could seriously damage the groove plate. Collisions can occur if there are substances on the chuck that do not belong there, or for example, if a too thick wafer is being used.

The spring arrangement means that the sub-frame 600 is pressed up to the kinematic coupling by two springs in series at each corner of the sub-frame 600. The two springs have different force characteristics. First, only the weaker springs are used to lift the sub-frame 600. After contacting the kinematic mount, the stiffer springs push the sub-frame 600 against the kinematic mount. This two-step approach provides the necessary time to slow down the spindle drive motor of the main actuator.

As explained above, the chuck actuators 620 provide Z-axis position (i.e., perpendicular to a plane of the substrate and stamp). The Z-axis positioning at three locations provides 3 degrees of freedom ("DOF"), in that Z-axis translation and rotation about the X- and Y-axes can be controlled.

The groove plate has in-plane positioning control, and provides X- and Y-axis translation and can provide rotation about the Z-axis. Thus, 6 DOF position adjustment is enabled with a simple structure which maintains a desired stiffness of the carriers. The position control is split between the groove plate and the chuck.

In the design described above, deflection of the reference frame 630 and/or main (long stroke) actuator will not have any influence on the imprint gap. In particular, the sub-frame 600 is decoupled from the main actuator by the contact buffers 670. In this way, a separation of the force path and the position path has been established.

The example above makes use of separate chuck actuators to move the chuck relative to the sub-frame 600 and actuators for moving the groove plate. As an alternative, the chuck could be supported with a hexapod inside the sub-frame 600. The hexapod would replace the three chuck actuators 620 of the chuck. A hexapod can move in 6-axes. So-called overlay alignment for X- and Y-axis translation and rotation about the Z-axis (for stamp to wafer adjustment) is implemented in the design shown above by moving the groove plate 102 and 103 inside the groove plate holder 612 or 888 in FIG. 14, which functions as an alignment station (see FIG. 14). With a hexapod, this could then also be done by moving the chuck with 6 DOF. However, this may introduce additional difficulties in enabling sufficiently accurate overlay alignment as well as sufficient Z-axis stiffness of the chuck support. A hexapod will also result in a lower stiffness and less accurate alignment capability, but it can simplify the module so that manufacturing and development cost can be lower. Linear actuators, air bearings, short stroke manipulators, or flexible hoses for the grooves would then not be needed.

As an alternative for the pins and slots 666 used for mounting the sub-frame 600, also flexures could be used such as folded sheet flexures.

The arrangement shown enables automatic tilt adjustments of the chuck for rotations about the X and Y axes. In some designs, the position of the stamp landing ring relative to the chuck can also automatically be adjusted using position sensing. Wedge compensation is also possible (i.e., the parallelism error of the stamp).

A second aspect of the invention relates to a design of the chuck, again to enable the dimension increases discussed above.

Figure 8:
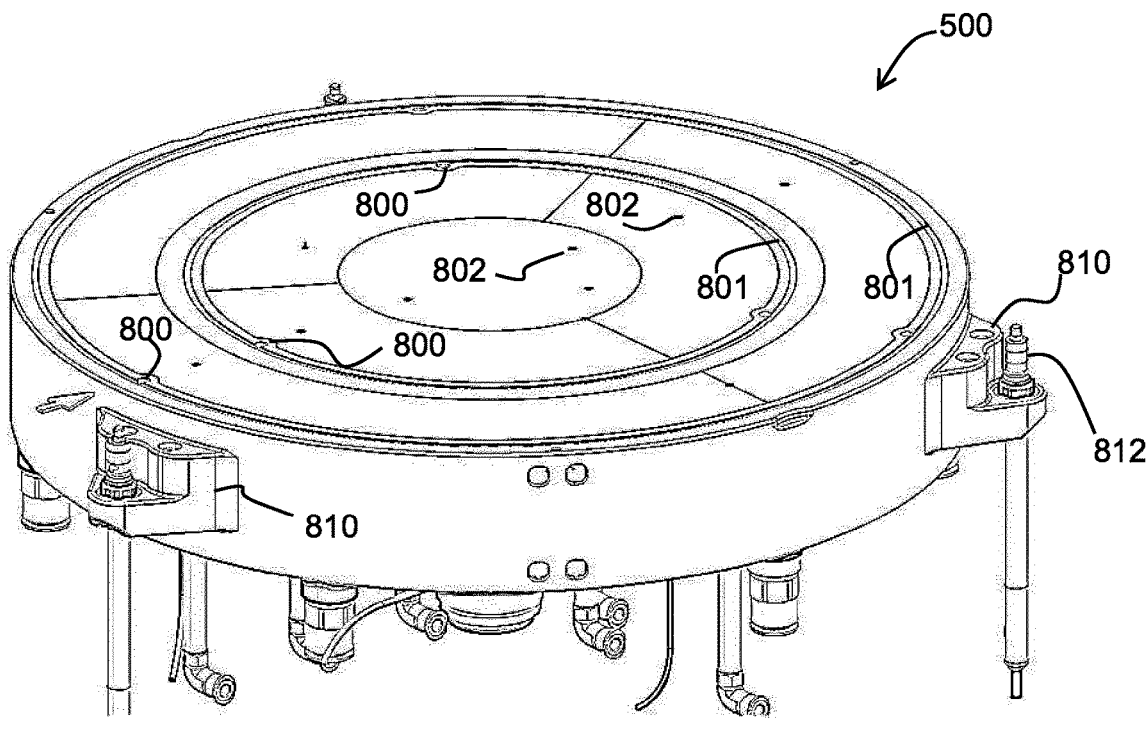
FIG. 8 shows an example of the chuck.
Figure 8:
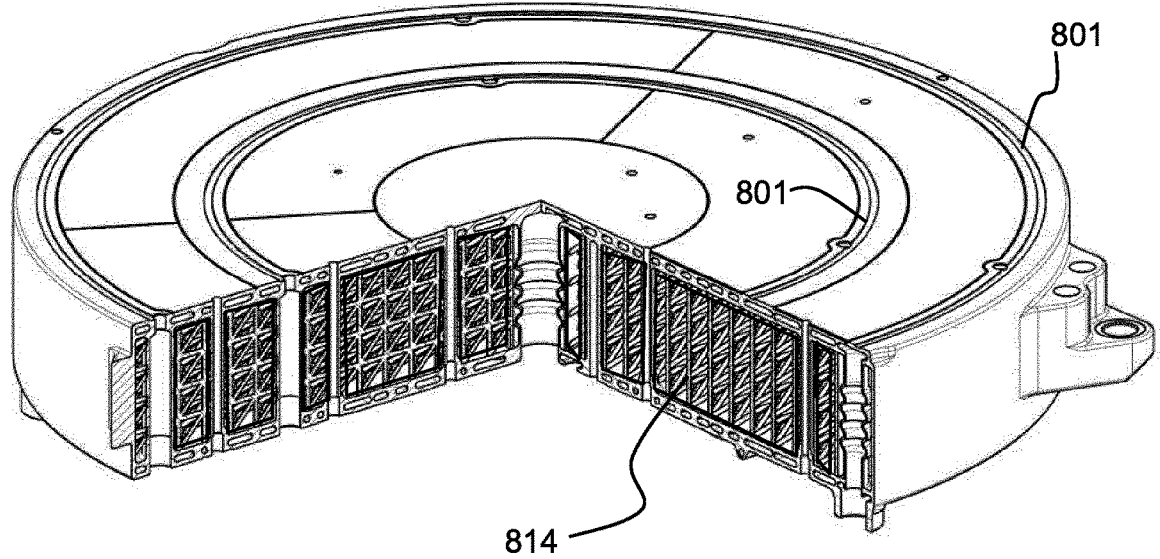

FIG. 8 shows the chuck 500. The top image shows a perspective view showing the top and bottom image shows a partially cut away perspective view to show the internal structure. The chuck 500 has a flat top face for receiving a wafer. It is designed to receive a 200 mm diameter wafer or a 300 mm diameter wafer. Vacuum openings 800 are located at the approximate locations of the outer periphery of the wafers. These vacuum openings are for clamping the wafer. Radially outside the vacuum openings 800, there are annular spillage grooves 801 for catching overspill of resist which may happen during the imprinting step. The overspill grooves 801 prevent that the chuck is polluted by the wet resist on top of the wafer. If the resist doesn't contact the chuck 500, it will not stick to the chuck 500.

The top face also has openings 802 which enable the passage of lifting pins to lower the wafer on the chuck and raise the wafer off the chuck 500.

The chuck 500 is formed as a hollow structure. This enables it to have low thermal mass while also having a large thickness to provide the required stiffness. The chuck 500 is generally cylindrical. Mounting points 810 are formed around the outer periphery, and these engage with the chuck actuators 620. At each of these mounting points, there is also a sensor 812 for measuring a spacing to the groove plate.

A hollow lattice structure is defined between top and bottom faces. These top and bottom faces include a water channel arrangement for temperature control. The same temperature control is provided to the top and bottom faces to provide symmetry and prevent buckling. For example, the structure and water channel layout may be the same.

The water channel arrangement for example covers the full area of the chuck. The temperature control of the top face is for the heating and cooling of the wafer and hence the resist layer provided over the wafer.

Within the hollow area between the top and bottom faces, there is a lattice structure 814 to provide stiffness and rigidity. Thus, there is a sandwich design with a lattice structure inside to provide the desired stiffness. The lattice structure is for example a cubic lattice (simple, or body centered or face centered) or a hexagonal lattice. The cell size and beam size is chosen to provide the required stiffness.

Connections for the water channels (e.g., a set of water entry ports and a single water exist port) as well as the vacuum connections are all placed at the bottom face of the chuck.

The chuck 500 is for example designed to be manufactured by powder bed fusion for metal 3D printing. It is made of stainless steel. After the 3D-printing and removal of the powder, finishing is performed with a milling machine. With a lapping process at the end, the required flatness of 5 μm for the top surface is fulfilled.

Figure 9:
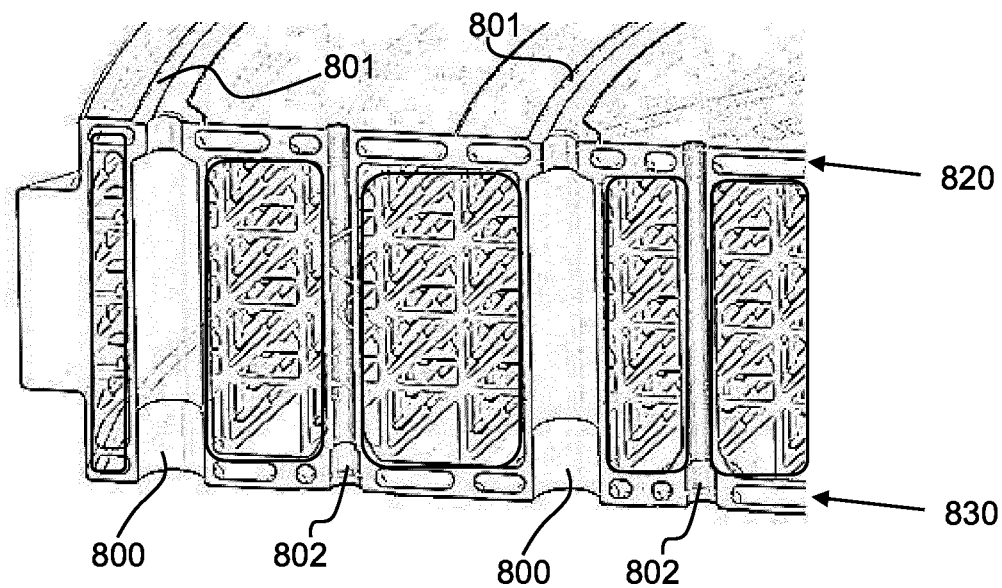
FIG. 9 shows two cross sections of portions of the chuck, showing the top face and the bottom face of the chuck and the heating water or cooling water channel arrangements in the top and bottom faces.
Figure 9:
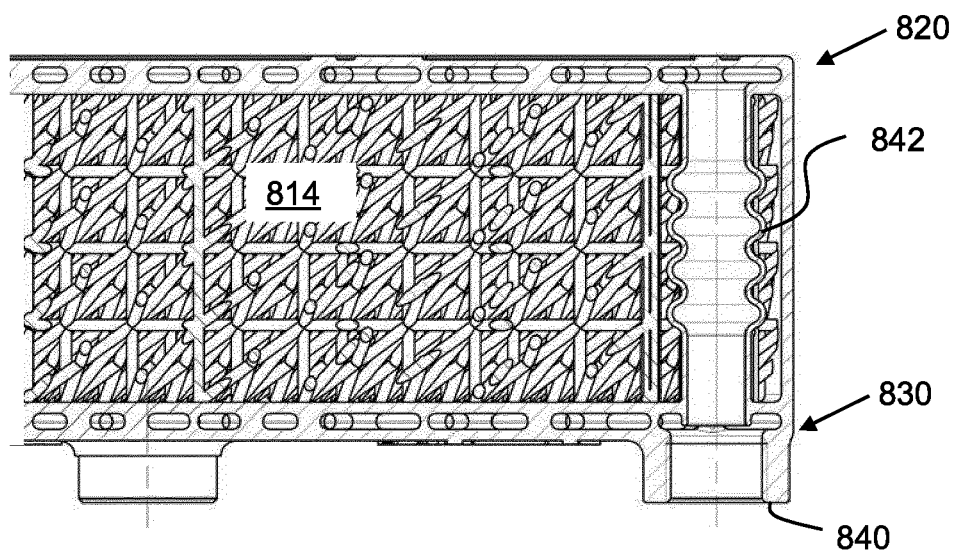

FIG. 9 shows the internal structure in more detail. The top part of FIG. 9 is a cross section showing the top face 820 and the bottom face 830, which each enclose a channel arrangement. The thickness of each of the faces is for example 5 mm with a 1.5 mm skin above and below a 2 mm water layer.

The total thickness of the chuck is for example in the range 40 mm to 100 mm thick.

Two vacuum openings 800 are shown as well as the overspill channels 801. Two alignment pin slots 802 are also shown.

The bottom part of FIG. 9 is another cross section to show how heating water (e.g., at 60 to 70 degrees) or cooling water (e.g., at 20 degrees) is supplied to the channel arrangements in the top and bottom faces. One water supply duct 840 is shown. There are for example six such supply ducts around an outer periphery of the chuck.

The supply duct 840 opens at its base to the channel arrangement within the bottom face 830 and also has a conduit 842 between the bottom face 830 and the top face 820, which terminates at the channel arrangement within the top face 820.

The top and bottom faces 820 and 830 enclose their respective channel arrangements. The central lattice area of the chuck is sealed from the water supply.

The conduit 842 has a bellows structure so that axial stresses in the conduit can be compensated by deformation of the conduit rather than inducing deformation of the surrounding parts of the chuck which could lead to a loss of flatness. However, the bellows of the conduits are an integral part of the structure of the chuck.

The chuck for example has a single water exit duct at the center of the chuck for collecting water after passing through the channel arrangement.

Figure 10:
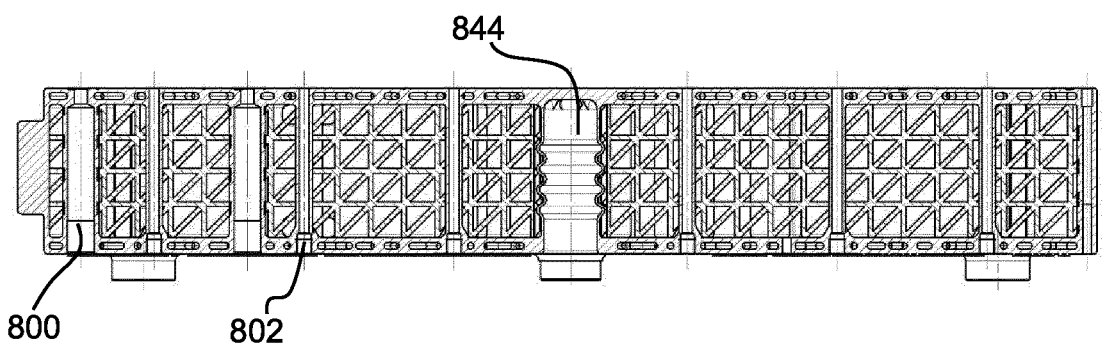
FIG. 10 shows a cross section of the whole chuck.

FIG. 10 shows a cross section of the entire chuck. It shows that the water exit duct 844 in the center also has the same bellows design as shown in FIG. 9.

Figure 11:
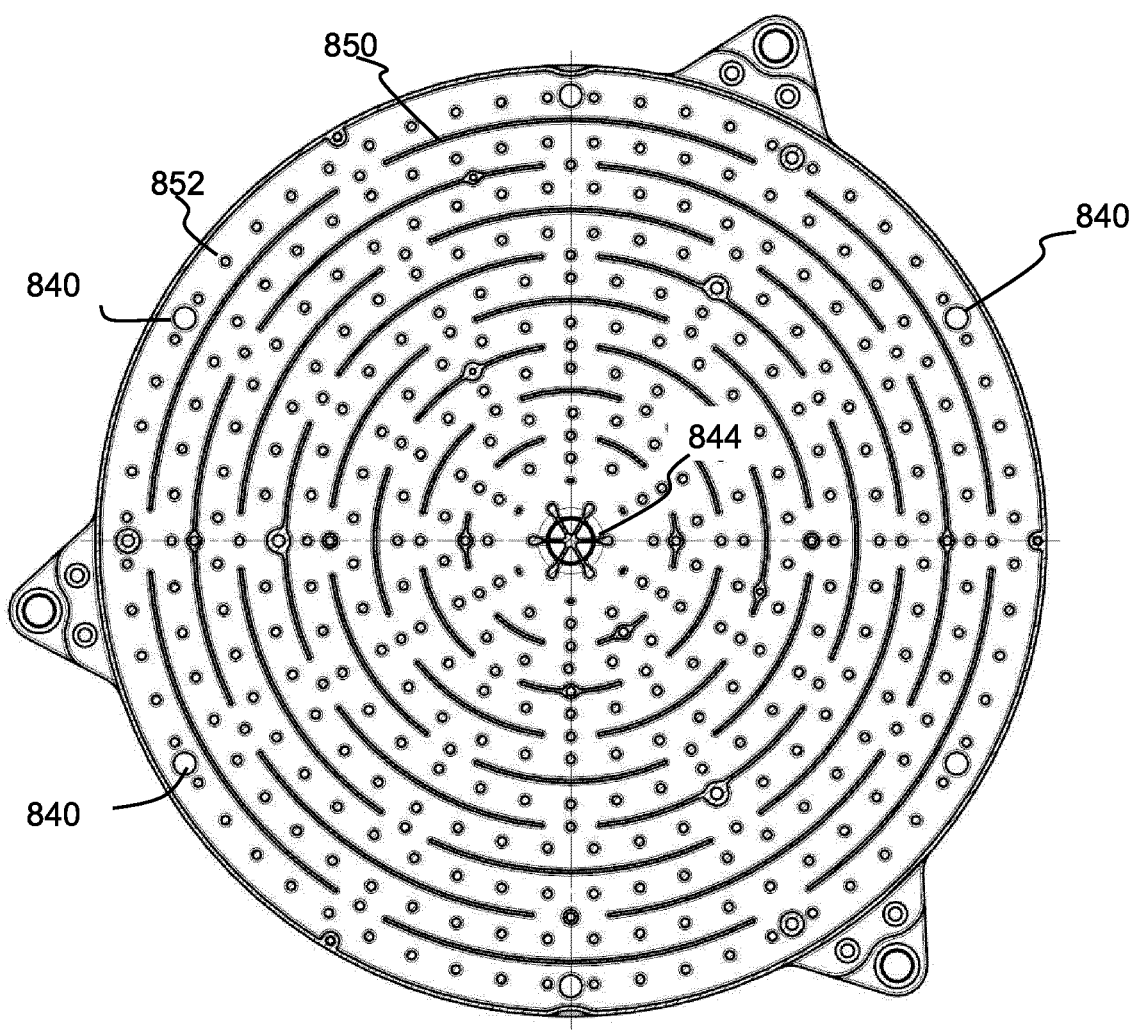
FIG. 11 shows a set of ridges within the upper face or lower face to define the channel arrangement.
Figure 11:
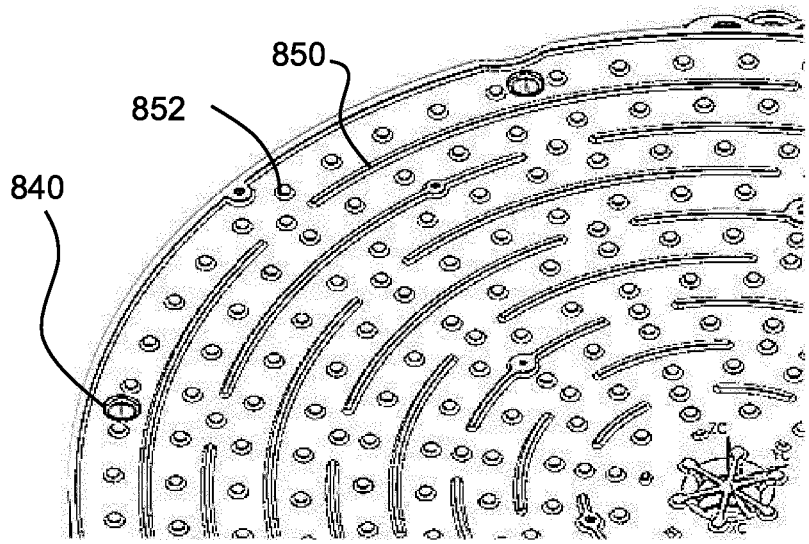

FIG. 11 shows a set of ridges 850 within the upper face or lower face to define the channel arrangement. Thus, it shows an opened-up area of the top or bottom channel arrangement. The top image is a plan view and the bottom image is a perspective view to show the three dimension nature of the ridges and projections. The six fluid entry ducts 840 are spaced around the periphery, the locations of two of which are shown in FIG. 11, and the single fluid exit duct 844 is shown at the center. The ridges 850 mean the water has to follow a meandering path from the locations of the fluid entry ducts to the fluid exit duct, with circumferential path sections and radial path sections. The ridges 850 form a set of discontinuous annular paths, and the gaps in one annular path are staggered with respect to the gaps in the adjacent paths to define the meandering path. In addition to the ridges, which function as dams, there are pillars 852 around the annular paths which serve to support the skin to remain flat and, additionally or alternatively may increase turbulence.

This design provides a homogeneous water temperature distribution covering the full area of the chuck, caused by multiple mixing locations for the water.

Connections for the supply of water, the removal of water and vacuum connections are all placed at (beneath) the bottom face of the chuck. This leaves the place free for a movable stamp landing ring around the chuck.

Thermal sensors may be additionally mounted at the bottom face. Thus, there may be sensors to measure temperature in the top and bottom surfaces.

Figure 12:
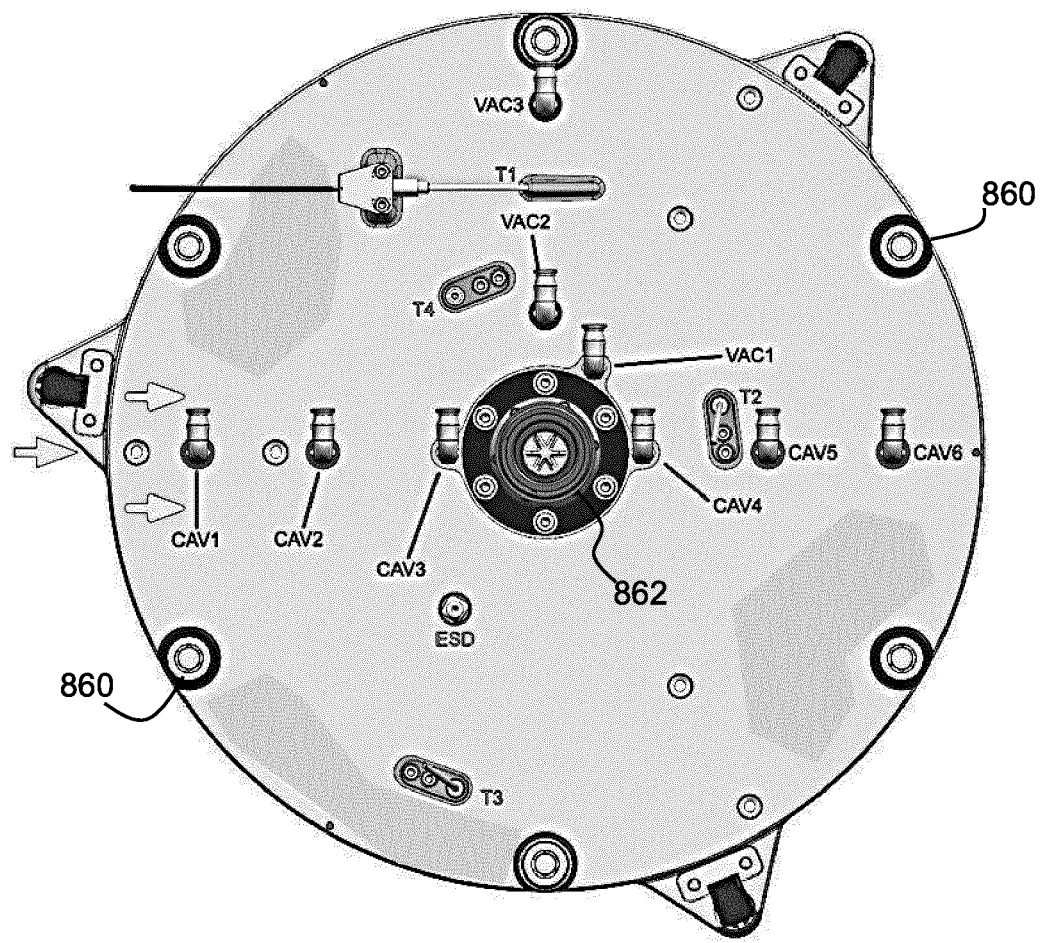
FIG. 12 shows the underside of the bottom face of the chuck.

FIG. 12 shows the underside of the bottom face, and shows water inlet connections 860 around the periphery, a central water outlet connection 862, vacuum connections VAC1 and VAC2, and cavity connections CAV1 to CAV6.

These cavity connections lead to openings at different locations of the chuck surface, and they connect to a pressure source for applying an under- or overpressure.

The cavities are used to enable printing on both sides of a wafer. After the first side has been printed, the pattern should not be touched and in particular not pressed over a flat surface once turned over.

Figure 13:
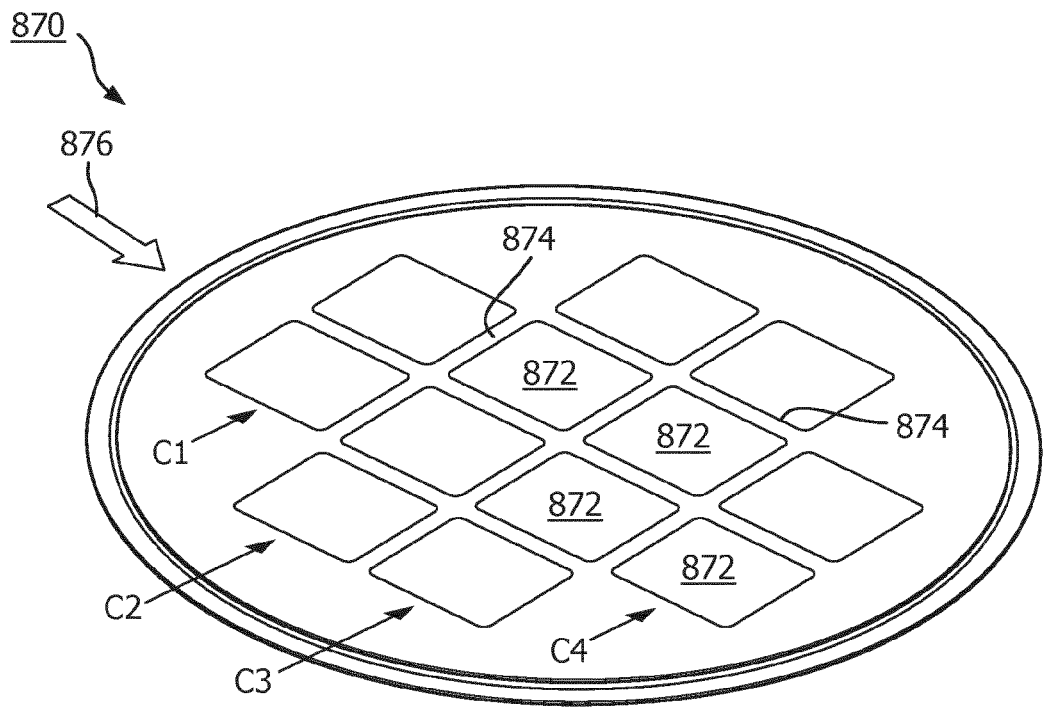
FIG. 13 shows an interface plate for use with the chuck.
Figure 13:
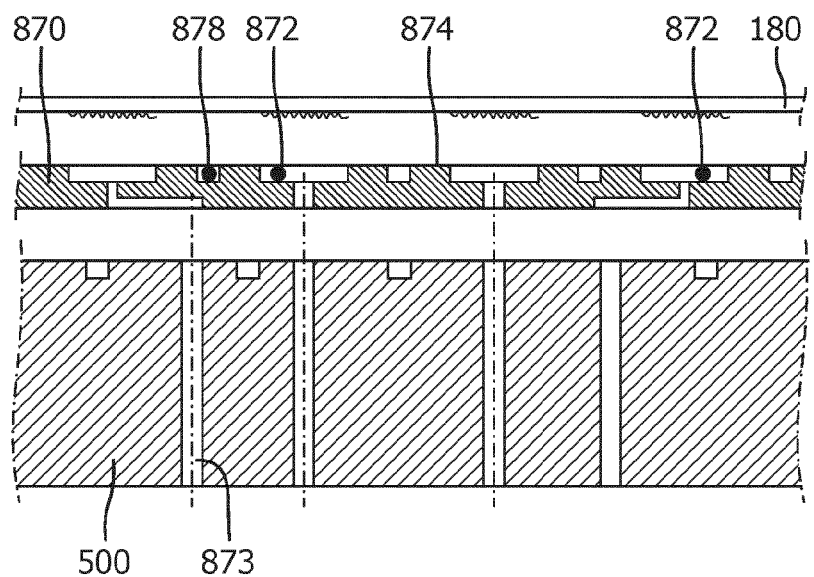

To enable two-sided printing, an interface plate 870 as shown in FIG. 13 may be provided over the chuck. The interface plate is a metal or aluminum plate that can be removably positioned on top of the chuck. FIG. 13 shows an example of the interface plate in perspective view (upper drawing) as well as in cross section view (lower drawing) over the chuck 500.

The interface plate 870 has a grid of openings 872 so that when a printed wafer 180 is placed over the interface plate 870 (with a first already-printed side facing down) the printed areas of the wafer (which will be diced to form separate products) align with the openings, and the grid lines 874 of the interface plate 870 are over (aligned with) non-patterned areas of the wafer.

The openings may extend straight through (e.g. 872a) the plate 870 or they may have offset shapes (e.g. 872b) as can be seen in the cross section of FIG. 13. A sufficient depth is required to receive the printed substrate layer so that the surface is not contacted. The extension of the openings 872 to the side of the plate facing the chuck are arranged such that when the plate is attached to the chuck, the openings line up with pressure lines 873 within the chuck.

By providing pressure lines 873 through the chuck 500 to the openings 872, the pressure in the cavities (openings) can be controlled in synchronism with the printing process. In particular, by providing a positive pressure when the printing bulge of a stamp is present, a counter pressure is used via the pressure lines to support the wafer against the pressure of the printing bulge during the printing process, instead of using a solid chuck surface. If the printing bulge advances in the direction of the arrow 876, a supporting pressure may be applied in sequence to a first to fourth columns C1 to C4 of openings 872. Thus, for example, the interface plate of FIG. 16 uses four cavity (opening) connections. However, there may be more columns of independently operable cavities, and FIG. 12 indeed shows six cavity connections CAV1 to CAV 6 at the bottom of the chuck that may be independently operated. The cavity connections lead to openings in the chuck via the pressure lines 873 and the openings in the chuck are located within the openings 872. If no positive pressure is applied, an underpressure can be or is applied to those openings (which are closed at the top side of the interface plate by the wafer). Underpressure provision helps adhere the wafer to the plate and plate to the chuck via a clamping effect.

The interface plate 870 is for example a 1 mm thick stainless steel plate with a set of cut outs preferably formed by chemical etching. To mount the interface plate over the chuck, the interface plate for example has a set of, e.g. 3, openings which slide over receiving pins of the chuck 500. The interface plate also has vacuum grooves 878 for areas between the openings 872. The vacuum grooves 878 in between and around the cavities clamp the wafer to the cavity plate.

Note that the interface plate may instead be an integral part of the chuck. In such case the plate is not removable from the chuck.

The openings 872 prevent contact of already imprinted structures with the wafer support as mentioned above. The interface plate also makes it possible to support, or to clamp, a wafer at any desired positions. The openings are connected via the chuck to pressurized air and/or vacuum. Openings and channels in the bottom of the interface plate connect the supplies of the chuck to the cavities.

The interface plate 870 has a low thermal mass and a high thermal conductivity, so that it slows down the printing process as little as possible. The plate is preferably made of aluminium, but other materials such as stainless steel can also be used. Stainless steel has a lower thermal conductivity than aluminium (which is less preferred), but since the plate is thin, such lower thermal conductivity can be used. Those skilled in the art will know how to balance thermal properties of materials in question and the geometric design to arrive at useful plates.

The required flatness and parallelism of the cavity plate is around +/−5 µm. For a stainless steel plate, this can be achieved by using an etching process for creating the cavities. Milling causes stresses in the material which can lead to involuntary deformations.

The interface plate 870 gives more flexibility for implementing further designs. The chuck 500 itself cannot be exchanged for imprinting different designs. However, for each stamp design, a separate interface plate 870 can be designed and manufactured.

Thus use of a pin and slot coupling (e.g., 2 or more, preferably 3 or more, pins and slots combinations) between the interface plate 870 and the chuck 500 prevents shifts due to thermal expansion and additionally may prevent or reduce warping.

Some design options will now be explained.

A stainless steel plate is preferred. For a stainless steel plate, the plate is preferably thinner than 2 mm. A thin plate has a low thermal mass and high thermal conductivity compared to a thicker plate. A thin plate also has low stiffness so it can easily bend. The plate will align itself with the flattened top of the chuck under the vacuum force. A thin plate also gives good thermal transition from the chuck to the cavity plate. The flatness requirement, which can be important for the imprint gap, is also met. A thin plate is also preferred, because of the range of the short stroke manipulators of the chuck, such as 2 mm.

The plate should however also not be too thin. The vacuum channels cannot then be made deep enough, resulting in too many flow losses and an insufficiently strong vacuum. The force to hold the wafer onto the cavity plate will then be too small. The cavities and grooves can be or are made by a chemical etching process.

Stainless steel has a much lower thermal conductivity than aluminum. Nevertheless, the stainless steel plate will approximately add less than 2 seconds of heating time and 2 seconds of cooling time.

An aluminum plate is a possible but less preferred option. For an aluminum interface plate, aluminum has a better thermal conductivity and a lower thermal mass then stainless steel. It could therefore be made thicker for better manufacturability. Stress free casted aluminum is only available from 10 mm thickness and higher. Normal aluminum sheet material already has too many internal stresses because of the rolling processes of the raw material.

With the thicker plate, the vacuum channels can be made deep enough, resulting in enough flow and a sufficiently strong vacuum to hold the wafer. Cavities and grooves cannot in this case be made by a chemical etching process. Chemical etching is not possible using aluminum. The alternative, milling, causes stresses in the material. This leads to involuntary deformations. Tension-free annealing may be used.

The thicker aluminum plate will be stiffer than a thin stainless steel plate. However, it will not align itself with the flattened top of the chuck. This can lead to a gap between the chuck and the cavity plate and therefore leakages of the vacuum, resulting in no vacuum to hold the cavity plate to the chuck. Furthermore, such gap may reduce heat transfer between the plate and chuck thus reducing heating and cooling rate during use of the apparatus.

It is, however, difficult with an aluminum plate to provide the desired thermal transition from the chuck to the cavity plate and to meet the flatness requirement, which is important for controlling the imprint gap. The thicker plate is also not preferred due to the short stroke manipulators of the chuck. However, in printing machines with only one Z-stage, the thicker plate could be used.

As mentioned above, the short stroke manipulator (i.e., the chuck actuator 620) is another aspect of the design of the invention.

The same design of short stroke manipulator may be used as a stiff support and drive arrangement for the chuck as well as for the stamp landing ring. The short stroke manipulator is used to position the chuck and the stamp landing ring with 6 degrees of freedom (i.e., 3 translations and 3 rotations) when combined with the positioning of the groove plate as explained above.

The chuck, groove plate and stamp landing ring each have to be supported and correctly aligned with 6 DOF.

The groove plate can be moved in 3 DOF (X-axis translation, Y-axis, translation and rotation about the Z-axis), and the other 3 are fixed (Z-axis translation and rotations about X- and Y-axis.

The chuck and stamp landing ring can be moved in 3 DOF (Z-axis translation, and rotation about the X- and Y-axis), and the other 3 are fixed (X-axis and Y-axis translations and rotation about the Z-axis). One short stroke manipulator supports 2 DOF (Z-axis translation and fixed X-axis translation).

The manipulators are used as fine adjustment of the chuck and the stamp landing ring in the Z-axis direction and for rotation about the X- and Y-axes. As will be described further below, the chuck actuators are also used for force measurement and for shock absorbing.

Thus, the aligning and manipulating of the 6 DOF between the stamp and the wafer is realized by two separate aligning systems:

(i) Overlay alignment from the stamp to the wafer; translation along the X-axis and the Y-axis and the rotation around the Z-axis, is implemented by the groove plate alignment (i.e., stamp alignment).

(ii) Adjustment of the imprint gap; translation along the Z-axis and rotation about the X- and Y-axes, is implemented by the 3 short stroke manipulators (providing support of the chuck).

For two-sided imprinting of a wafer (as discussed above), in addition to controlling the imprint gap, the overlay alignment is essential. The overlay alignment specification requires a very high position accuracy. Friction and hysteresis free overlay alignment are critical. A large alignment range also needs to be covered in the horizontal plane, such as up to 5 mm or even up to 15 mm of linear movement. The allowed forces of the piezo stepper drives are also limited such as a maximum of 50 N.

Controlling the imprint gap is achieved by the two-stage chuck support described above. For overlay alignment, two markers on the stamp and two markers on the wafer are used. A camera system on top of the groove plate measures the coordinates of these four markers. The groove plate is transparent for this purpose. Both the markers of the wafer and the markers on the stamp need to be in focus (i.e., at the correct height) of the camera system.

The system compares the coordinates of the four markers and a transformation matrix is used, to calculate the desired movements for the three short stroke actuators. For reaching a better accuracy, this control loop can be repeated several times.

As mentioned above, one option to control all 6 DOF is to manipulate only the chuck. A hexapod could be used for that as explained above. However, a hexapod that meets the requirements is not commercially available. Splitting the alignment functions in the manner outlined above makes it possible to meet the requirements.

One aspect of the invention makes use of an alignment stage which contains a movable groove plate carrier 612. The groove plate carrier can be positioned by translation in the X-axis and Y-axis directions and Z-axis rotation (Rz) without any friction or backlash. A large alignment range in the horizontal plane of the desired 5 mm (or even 15 mm) linear movement is possible.

Figure 14:
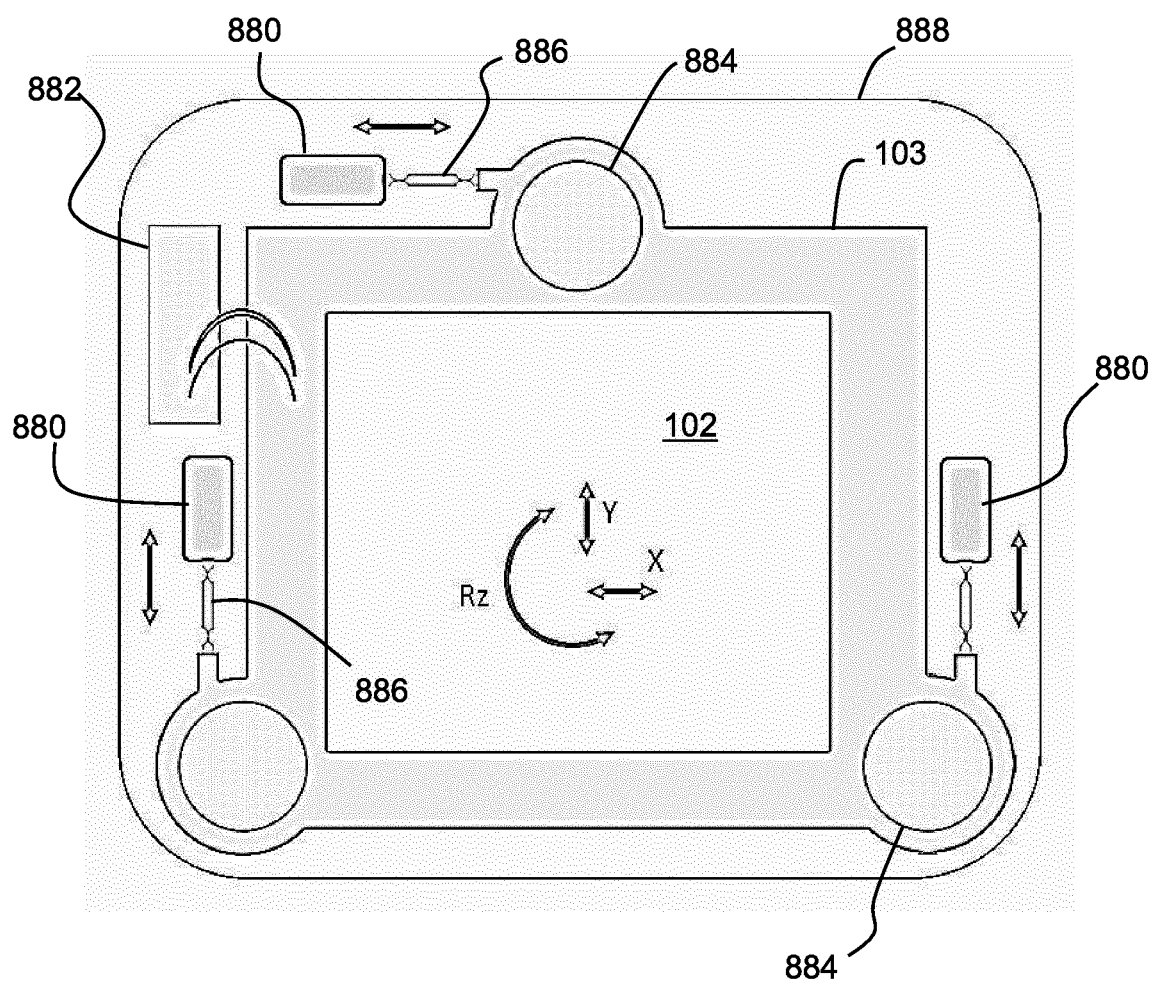
FIG. 14 shows a drive arrangement for the groove plate.

FIG. 14 shows the drive arrangement for the groove plate 102 (i.e., as part of the first carrier 102). This functions as an alignment stage. The groove plate 102 has a groove plate frame 103 as also shown in FIG. 6 which is driven by three linear actuators 880, each coupled to an associated pair of air bearings 884 via a flexure 886. While this is a preferred construction, the association is not necessary per se. The actuators can also be placed at different positions or angels such as for example three times 120 degrees rotated with respect to each other and 60 degrees rotated with respect to the air bearings. These may be named "carrier actuators" to distinguish from the chuck actuators and the stamp landing ring actuators. A pneumatic valve terminal 882 couples to the groove plate via flexible air tubes to provide the printing pressures explained above.

The groove plate frame can be positioned in X-axis direction, Y-axis direction, and Z-axis rotation (Rz) without any friction or backlash.

The translations in X-axis and Y-axis directions and the rotation around the Z-axis are established by the three actuators 880. The required forces for the linear actuators for example do not exceed 50 N. The actuators are mounted to the fixed world (i.e., a base 888) and are connected via the three flexures 886 to the groove plate frame 103. The three flexures allow lateral movement orthogonal to the actuator movement. The lateral shift prevents an over constrained groove plate frame 103.

The set of three pairs 884 of air bearings are used for Z, Rx and Ry fixation of the groove plate frame 103 inside the alignment stage. The air bearings are mounted to the fixed world 888. At each of three corners, a set 884 of two air bearings clamp the groove plate frame. One air bearing is on top of the groove plate frame and one is at the bottom (as can be seen in FIG. 6, but shown as a single unit in FIG. 14). The groove plate frame 103 is clamped between the air bearings above and below, so that the air pressure is equalized (in the Z-axis direction). The three corners set a fixed horizontal frame, and movement within that plane is allowed by each pair of air bearings. The allowed movement is for example around 10 mm, and is needed primarily for Rz adjustment.

One air bearing of each pair may be pre-loaded using a spring mechanism as can be seen in FIG. 6. This pre-load makes it possible to keep the air gap constant under all circumstances. The height of the air gap is a dominant factor for the stiffness of the groove plate support in the Z-direction.

The displacement coordinates of the frame 103 are calculated with a translation matrix.

In use, the markers of the wafer are positioned at the correct focus depth by operating the chuck support, which provides Z-axis positioning. After this, the horizontal alignment can be implemented.

Note that an alternative for the 6 air bearings is a set of (for example 3 or 4) folded leaf springs for Z-axis, Rx and Ry fixation. A disadvantage compared to the air bearings is that folded leaf springs require additional force of the linear actuators to move the groove plate. Leaf springs (e.g folded leaf springs) must be high, long and thick enough to provide the required movement in the X-axis direction, Y-axis direction, and Rotation around the Z-axis (Rz) and the stiffness of the groove plate frame 103, resulting in a larger force requirement for the (e.g., groove plate) actuators.

Figure 15:
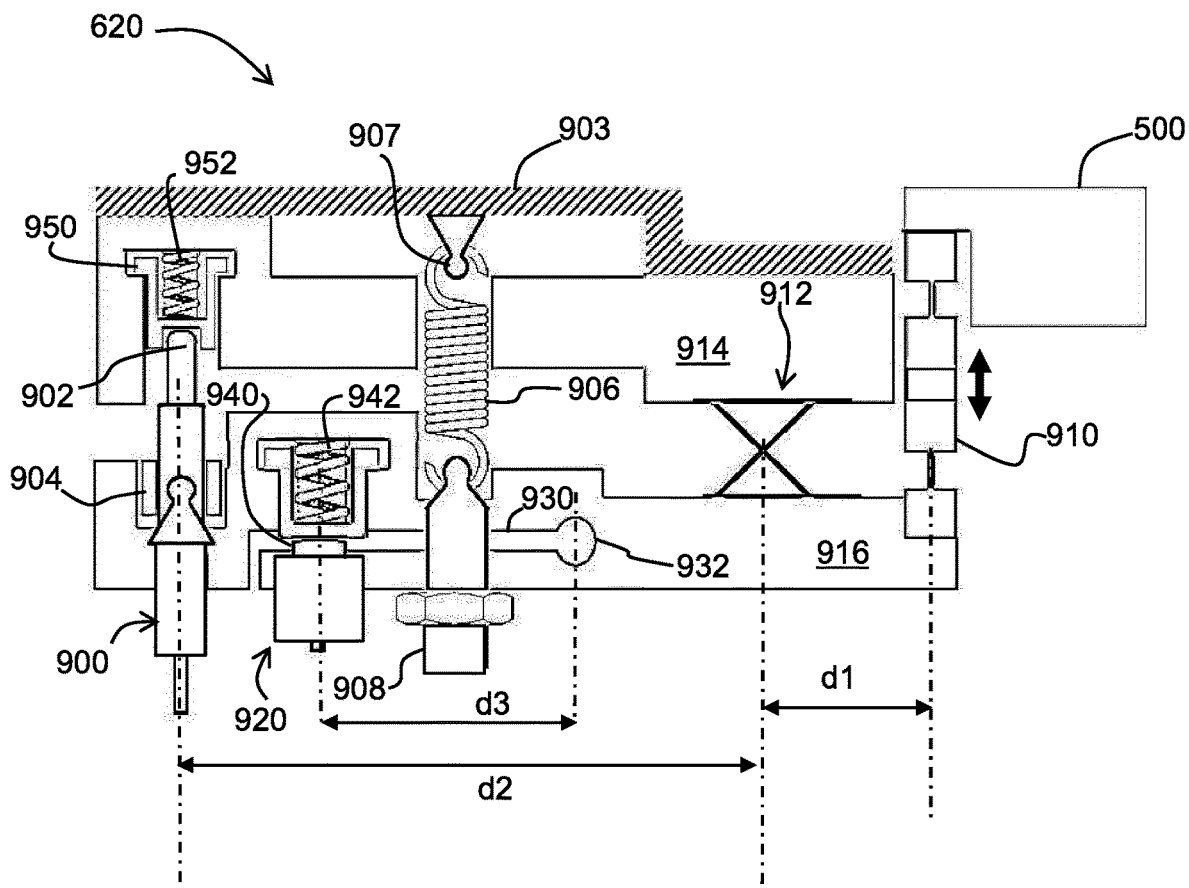
FIG. 15 shows a design of a short stroke actuator for use as a chuck actuator.

FIG. 15 shows in more detail the design of the short stroke actuator 620 for use as the chuck actuator. The same actuator may be used for the stamp landing ring, and again the sensor (described below) may be used for machine damage protection.

The chuck actuator comprises a drive element 900 such as a piston which drives an actuator tip 902 up and down. The actuator tip 902 position is fixed relative to the sub-frame at connection 903 and this is rigidly coupled to the real world (i.e., the reference frame 630) during printing as discussed below, so operating the actuator results in an actuator output 904, in the form of a drive coupling, moving up and down. A tension spring 906 pulls the short stroke actuator up. The top of the tension spring connects to pin 907 which is also connected to the sub-frame. The spring compression varies over the same distance as the stroke of the short stroke manipulators.

The tension spring 906 is adjustable and ensures a preloaded manipulator, free of play. The adjustment may be made by a threaded tube 908 which adjusts the position of one end of the spring (e.g., opposite the pin 907). The pretension of the tension spring 906 defines the allowed stamp release force. The higher the spring force, the higher the release force can be. The pretension of the spring may not be too high, because of the limited allowed load on an integrated force sensor 920 discussed below.

The actuator 900 comprises a lever arrangement with the actuator output 904 at one end and a chuck driver 910 at the other end. A pivot point 912 is along the lever arrangement and this is formed as a cross flexure pivot. A fixed part 914 of the lever arrangement connects to the reference frame (e.g., the sub frame 600), and the main body 916 of the lever arrangement is a movable part of the pivot point 912 which rocks about the pivot location. A lever ratio is defined as the ratio of the distance (d2) between pivot point 912 and actuator output 904 over the distance (d1) between pivot point 912 and chuck driver 910. The lever ratio (d2:d1) is for example 4:1.

The lever, e.g., with lever ratio 4:1, ensures that the support provided at the chuck driver 910 is 4 times more accurate and 16 times stiffer in the Z-axis direction than the actuator 900 would be without the lever arrangement. Thus, by using a lever, the imprint gap is better controlled.

The force sensor 920 is for measuring the process load and is integrated inside the lever. This enables better monitoring of the imprint process. The force sensor 920 is part of the stiffness loop, and the force sensor is placed in series with the actuator.

The main body 916 of the lever is split by a groove 930 for example of 0.2 mm. The moment created inside the lever by the force of the actuator is transmitted without any hysteresis via the senor 920 and a notch flexure 932. The sensor in this example measures a force of 0.443 times the load based on the ratio of d1:d3 (e.g., 30 mm to 67.71 mm). d3 is the rotational arm length from the notch flexure to the force sensor.

The connection 903, pin 907, and fixed part 914 all connect to the sub-frame 600. However, in use with the sub-frame pressed against the groove plate, the sub-frame becomes rigidly coupled to the reference frame (through the kinematic coupling). Thus, sub frame 600 is pushed against part 612 via the kinematic coupling 670.

The force sensor 920 comprises a force sensor element 940 which is biased by a compression spring 942 against a seat above the split 930.

The seat provides overload protection for the sensor. The force sensor element 940 is pushed against the seat by a pre-compressed spring 942. The seat will only move against the bias of the spring if the force on the sensor exceeds for example 250 N.

As long as the force sensor element is pushed against the seat when there is not an excessive force), the overload protection will have no impact on the stiffness loop.

The actuator tip 902 of the drive element 900 is limited by a stopper 950 fixed relative to the reference frame.

The stopper 950 comprises a ring which is pushed against the tip by a spring 952. The ring can move against the bias of the spring if the force on the sensor exceeds for example 250 N. As long as the tip is against the stopper with the spring not compressed, the spring will have no impact on the stiffness loop. This prevents the spindle of the actuator being damaged by an impact force.

The force sensor and the actuator are in this way protected against overload by shock, for example the load of the force sensor should be limited between −30 and +300 N, otherwise the sensor or actuator can be damaged.

A negative force to the sensor is prevented by the split groove design. The split groove inside the lever will become wider in the event of a negative force, so that the sensor will lift from its contact point. The force will thus be zero. A positive force, however, can be higher than 300 N due to shock, and therefore the force limiting arrangement described above is used.

The force sensor is also able to detect a stamp that is sticking, and can be used to prevent machine damage.

Stamp sticking is a problem which is preferably detected. It happens when the stamp release sequence after the imprint process does not work. This situation can occur when a stamp is being used too many times. The rubber relief part of the stamp will no longer be removed from the wafer.

At the end of the imprint process, the support (e.g., glass or metal plate) of the stamp is held by a vacuum against the groove plate and the wafer is held by a vacuum against the chuck. The groove plate, stamp, wafer, and chuck function as one monolithic body at this point. Normally after the imprint and stamp release sequence, the chuck is lowered, in this case by the chuck actuators and the main actuator. At this moment, the chuck will be lifted and the actuators lose contact.

In such a case, a gap between the actuator tip 902 and the stopper 950 can result, for example with a dimension of 2 mm to 8 mm. If the chuck suddenly drops, it can fall down by around 0.5 mm to 2 mm. This generates a shock with an impact force of around 5000 N on the actuator. This shock will result in a broken force sensor and a damaged spindle of the actuator.

Lifting the chuck is necessary to protect the groove plate from an excessively large load. The main actuator 640 can easily cause too much pulling force via the stamp on the groove plate. Thus, by detecting a sticking stamp, the main actuator can be stopped. The groove plate may thus be protected from damage.

Figure 16:
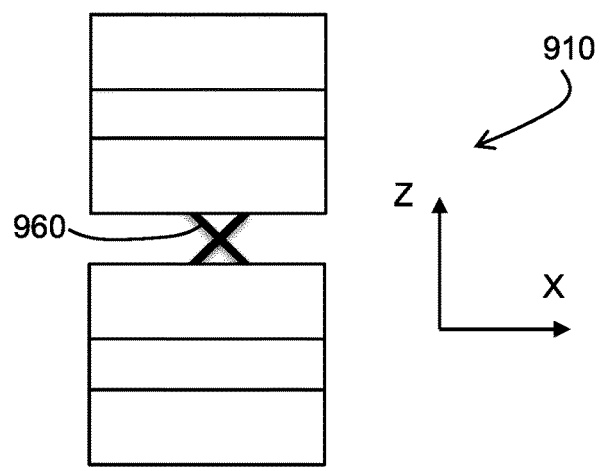
FIG. 16 shows the drive element used in the actuator of FIG. 15 from a different view.

FIG. 16 shows the chuck driver 910, mounted between the lever and the chuck, as an end view. It has a cross flexure 960 in the middle of its width (e.g., perpendicular to the Z-axis). This allows some rotational movement in the width direction of the chuck driver, e.g., rotation about the Y-axis direction for the example shown.

The purpose of this movement is to allow the chuck driver 910 to adopt a correct position after the tilt of the chuck has been adjusted.

The chuck driver 910 comprises a shortening compensation leaf spring.

When the lever rotates around pivot 912, the right side of the lever (the shorter side) shortens as seen from the center of the chuck. This shortening is a parasitic movement of the lever. The length when projected onto the plane of the chuck is shorted so that it becomes $L(1-\cos(\varphi))$ where $\varphi$ is the rotation angle of the lever. The lever arrangement compensates for this so that the position of the chuck in the X-axis and Y-axis directions does not change in response to an adjustment of the Z-axis direction position.

This design allows the three chuck actuators to individually move over the complete stroke of the lever. This enables zeroing of each actuator and prevents over constraining the chuck.

The forces on the chuck in the X-axis and Y-axis directions (parallel to the wafer) are routed via the cross flexures 912 and 960 of the three levers and the chuck driver 910. Each lever thereby provides two degrees of freedom; translation along the Z-axis and the X-axis.

The short stroke manipulator design may be used as the chuck actuator for movement of the chuck and as the landing ring actuator for movement of the stamp landing ring. Thus two short stroke manipulators may be placed at each corner of the triangular sub-frame 600, one constituting a chuck actuator and the other constituting a landing ring actuator. This provides a modular design.

Note that in this design, the tension spring 906 both pulls the senor tip to the lever and pulls the actuator tip to the stopper. However, two separate springs could be used. This would mean that the load on the sensor would not be (or less) influenced by adjusting the pretension of the tension spring and/or by a different position of the lever.

As mentioned above, another aspect of the invention is the ability to control the position of the stamp landing ring. Some further refinements relating to the stamp landing ring are discussed below.

As explained above, before starting the imprint process, the substrate (wafer) is brought into close proximity e.g., 25 to 300 μm to the stamp, providing a process gap. The groves of the groove plate are successively pressurized and the stamp bulges out from the groove plate towards the substrate spanning the process gap until it contacts the substrate, and is supported by the substrate. The resist layer of the substrate is solidified during contact and the stamp is removed after such solidification by supplying vacuum to the grooves again. Thus, the process of stamp application to the substrate uses a pressure difference between areas of the stamp that are held to the groove plate and areas that are pushed towards the substrate. Such differences arise at the edges of the stamp. The difference is a cause of pressure leakage and may result in uncontrolled stamp application and/or removal. In general, the larger the process gap between the groove plate and the substrate (or chuck), the larger the leakage and therewith the larger the loss of pressure under the stamp. Thus, the process gap needs to be controlled accurately over the whole area of the stamp.

Different stamps differ from one to the other at the edges. There will be an area of the support (the groove plate) not covered by stamp material at the edges. Hence this area is not supported during stamp manipulation because only the stamp is contacting the wafer that is supported. This lack of support allows bulging of the stamp beyond the set process gap at these areas and this may induce additional leakage.

The stamp landing ring mentioned above surrounds the chuck to provide stamp support at this edge area such that the whole flexible stamp area that bulges can be prevented from bulging out beyond the set process gap. However, different stamp and substrate (wafer) combinations require different actively controlled thicknesses and gaps, with a different area outside the stamp and different thickness of stamp.

The stamp landing ring is an additional edge support structure which prevents the stamp at the edges from bulging beyond the set process gap by supporting that part of the composite stamp.

Figure 17:
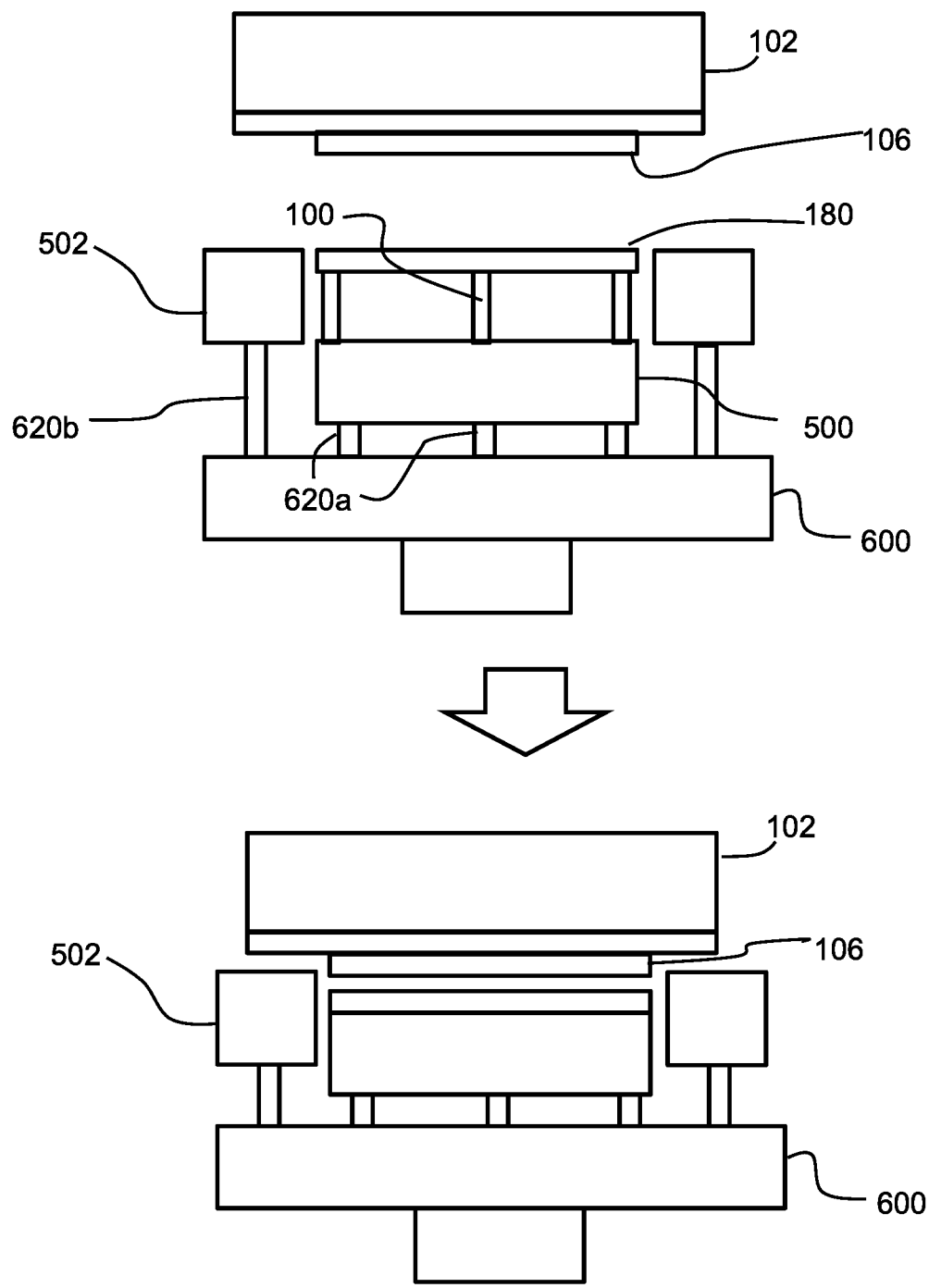
FIG. 17 shows how a stamp landing ring is used.

FIG. 17 shows the process using a stamp landing ring.

The top image shows the substrate 180 raised above the chuck 500 by supporting wafer lift pins 1000 and the chuck spaced from the groove plate 102 on which the stamp 106 is mounted. The chuck 500 is driven relative to a chuck assembly, such as the sub-frame 600, by the chuck actuators 620a.

A stamp landing ring 502 is driven relative to the sub-frame 600 by the landing ring actuators 620b.

The configuration at the top allows the substrate 180 and the stamp 106 to be loaded and unloaded.

The imprint position is shown at the bottom.

The process gap between the substrate 180 and the stamp 106 is the same as the process gap between the stamp landing ring 502 and the groove plate (or more particularly the glass supporting plate of the stamp) outside the area where the stamp material is present.

The use of separate chuck actuators and landing ring actuators enables different combinations of substrate (wafer) thickness and stamp thickness to be tolerated.

In addition, further refinements discussed below enable different imprint configurations for various stamp size (in plan view) and wafer size (in plan view) combinations, e.g., combinations of 200 mm or 300 mm substrates with 200 mm or 300 mm stamps.

Figure 18:
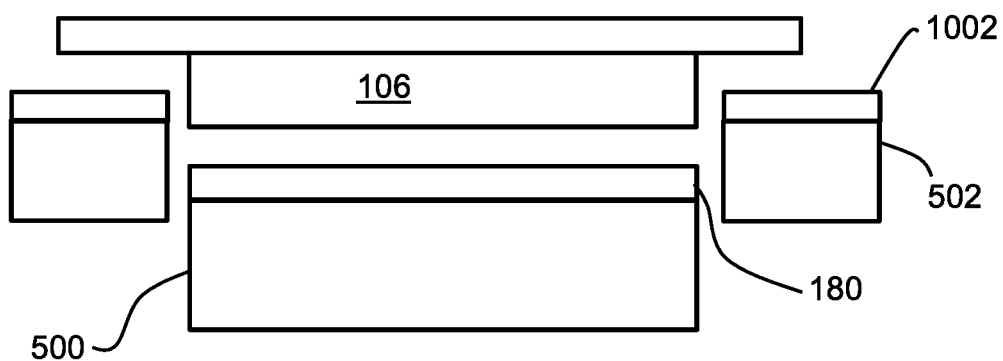
FIG. 18 shows a first use of a stamp landing ring adapter.

FIG. 18 shows a substrate 180 supported on a chuck 500. The stamp landing ring 502 supports the area outside the actual stamping area. FIG. 18 shows a stamp landing ring adapter 1002 over the stamp landing ring. The adapter design has the same shape and size as the stamp landing ring, and hence it provides a thickness adaptation. For example, FIG. 18 shows a 300 mm wafer 180 with a 300 mm PDMS stamp 106. The process gap will be defined by the distance between the wafer and the stamp and the adapter 1002 and the thin glass support of the stamp.

However, the stamp landing ring adapter may also adapt the stamp landing ring in dependence on a size of the substrate.

Figure 19:
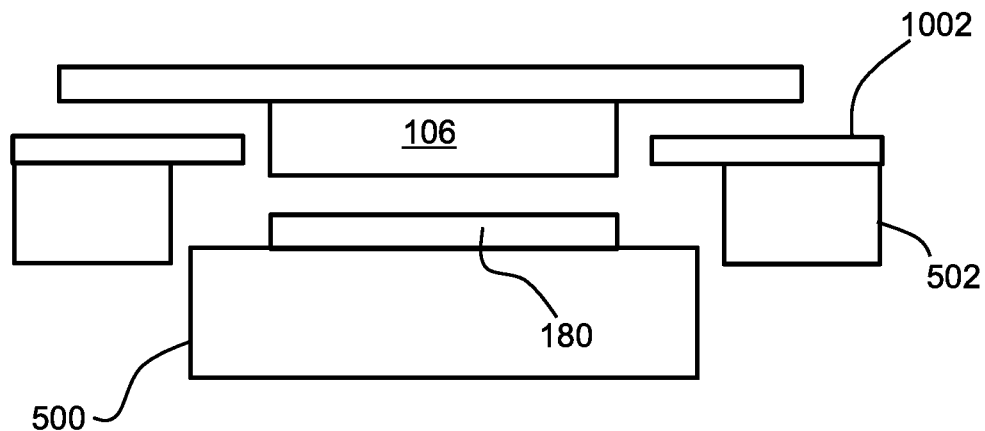
FIG. 19 shows a second use of a stamp landing ring adapter.

FIG. 19 shows an example where the stamp landing ring 502 is for fitting around a substrate of a first size (e.g., 300 mm) and the stamp landing ring adapter 1002 is for extending the size of the stamp landing ring 502 to fit around a substrate 180 of a second, smaller size (e.g., 200 mm).

In FIG. 19, the stamp landing ring 502 is for fitting around a flexible stamp 106 of a first size (e.g., 300 mm), and the stamp landing ring adapter is also for extending the size of the stamp landing ring to fit around a flexible stamp 180 of a second, smaller size (e.g., 200 mm).

FIG. 19 thus shows a 200 mm substrate (wafer) with a 200 mm PDMS stamp. The process gap will be defined by the distance between the wafer and the stamp and the adapter and the thin glass. The adapter extended over and beyond the 300 mm chuck to support the PDMS stamp outside the wafer area. As the ring is relatively thin it can bend down due to the pressure under the stamp. This can be compensated by moving the stamp landing ring up relative to the chuck.

Figure 20:
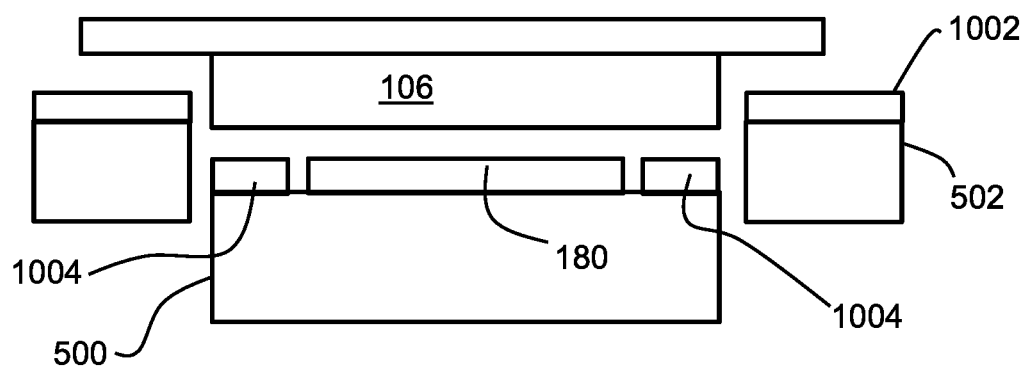
FIG. 20 shows an example using a second stamp landing ring.

FIG. 20 shows an example where the chuck 500 is for fitting around a flexible stamp 106 of a first size (e.g., 300 mm) and there is a second stamp landing ring 1004 for fitting over the chuck around a substrate 180 of a second, smaller size.

FIG. 20 shows a 300 mm PDMS stamp is to be used on relatively thin wafers (e.g., 200 to 300 μm). The overhanging stamp landing ring might not have a sufficiently high bending stiffness to compensate the pressure exerted by the stamp. The maximum thickness for such a stamp landing ring would be the thickness of the wafer.

The stamp would bend down the free hanging part too much, so that the stamp does not nicely transition on the wafer and cause imprint defects at or around the wafer edge, and stamp/pattern deformations deteriorating overlay alignment.

By having a stationary second stamp landing ring around the wafer as shown, with the same thickness as the substrate (wafer), the movable stamp landing ring 502 can be used to compensate for variation is stamp thickness and wedge by the chuck, and the whole stamp is still properly suspended over the whole area. The stationary ring 1004 does not have to be changed as the wafer thickness is typically within +/−10 μm or even +/−25 μm, which is not an issue and the stamp can transition from the stationary ring 1004 to the wafer smoothly.

Figure 21:
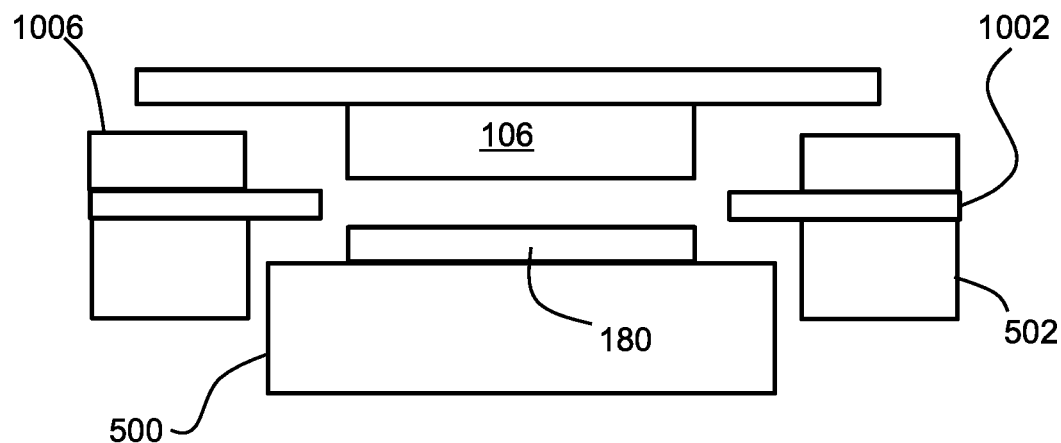
FIG. 21 shows an example suitable for imprinting relatively thick 200 mm wafers using a stamp landing ring with two thicknesses.

FIG. 21 shows an example suitable for imprinting relatively thick 200 mm wafers (e.g., 0.5 to 2 mm) using a 300 mm stamp which thus also needs to be correspondingly thick. The stamp landing ring adapter 1002 can have enough stiffness to counteract the pressure from the stamp on the overhanging part. Still the area of the stamp outside the rubber needs to be supported such that the stamp does not bulge out further than the process gap. This can be achieved by using a stamp landing ring with two thicknesses. The additional outside thickness provided by second adapter 1006 compensates for the stamp thickness.

The adjustable drive provided by the landing ring actuators reduced the need to replace the stamp landing ring to accommodate different stamp and substrate combinations. This allows (on the fly) adjustment to a wide variety of wafer thicknesses and stamp thicknesses and wedge angles and lead to an optimized imprint process for each case.

The optimized process gap leads to reduced pressure loss and an improved reproducibility in imprint quality with lessened pattern distortions and improved overlay alignment.

The stamp and wafer thickness for example need to have a known thickness to within around 10 μm, as it is desired that the process gap is defined to within this range. The same tool and stamp hardware and size may be used to handle a variety of wafer and stamp size combinations.

The chuck actuators and landing ring actuators enable dynamic changes to the gap between the stamp and substrate during separate stages of the process (e.g., alignment, imprint, release).

The printing process requires loading of a stamp onto the groove plate. In existing machines, the stamp is loaded by pivoting open a top cover which carries the groove plate. The cover could be manually turned by 180° so that the groove plate is presented upside-down. The stamp can then be placed with the glass plate side on the groove plate. The grooves have a small overpressure at this time, which creates an air bearing for the stamp. The stamp could thus easily be moved and aligned manually.

The position is then fixed by switching the grooves to vacuum. After this, the cover is closed again and the imprinting process can start. In case of a power down or a vacuum loss, the stamp will drop on top of the chuck. To remove the stamp, the top cover could easily be opened manually in the same way.

The design described above, with the groove plate alignment stage for overlay alignment, as well as the increased size of the wafer, means it is not desirable to have a pivotable cover, because it is too large, too heavy and too fragile).

Another design aspect thus relates to a semi-automatic stamp loading function, in which the stamp loading takes place from below the groove plate. The design approach described below also means that if the hold on a stamp is lost, (by power or vacuum loss) the machine does not need to be opened. An integrated stamp drop protection prevents the stamp from dropping, and the stamp can be unloaded via the normal unloading sequence.

Figure 22:
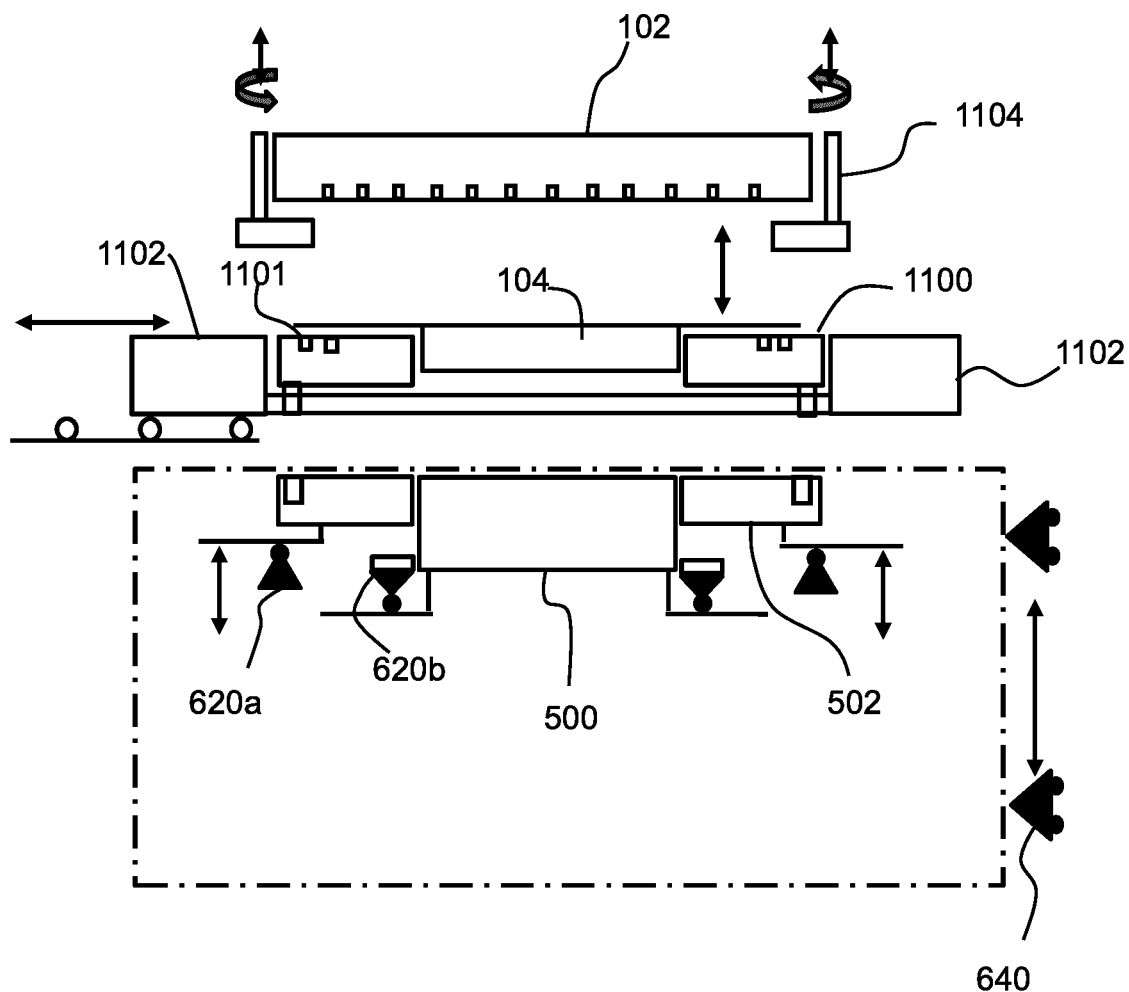
FIG. 22 is used to explain a semi-automated stamp loading process.

FIG. 22 shows a design with semi-automatic stamp loading.

FIG. 22 shows the groove plate 102 above the stamp 104. The stamp 104 is mounted on a stamp carrier 1100 which is positioned on a frame, in particular a sliding telescopic drawer 1102. Together, the stamp carrier 1100 and the drawer may be considered to comprise a stamp loader. The stamp carrier 1100 comprises a frame with a central opening to avoid contact with the rubber stamp material (PDMS). Thus, the stamp carrier 1100 supports the glass substrate of the stamp and the stamp does not move or sag, because the outside rim of the stamp is held by vacuum. The telescopic drawer 1102 transfers the stamp carrier 1100 in the horizontal direction, from the load position (outside the module), to a park position and then to the transfer position.

The long stroke driver 640 of the module, described above, is used for the vertical lifting of the stamp carrier 1100.

The stamp 104 is shown above the chuck 500 and the stamp landing ring 502. The stamp landing ring is positioned by the stamp landing actuator 620*a* and the chuck is positioned by the chuck actuator 620*b*.

This stamp loading mechanism loads and unloads a stamp 104 automatically from below, without opening a top cover. The groove plate 102 is positioned with the grooves facing downwards. A stamp drop protection 1104 is also integrated inside the frame of the groove plate 102.

The stamp 104 is held by vacuum on the outside rim of the stamp carrier 1100 by vacuum channels 1101. The stamp carrier 1100, for example, has two separate vacuum channels. One channel is used when the carrier is placed on the telescopic drawer 1102, the other channel is used when the stamp carrier is placed on the stamp landing ring 502. The presence of the stamp is detected by measuring the vacuum pressure.

The stamp loading sequence will now be described.
(i) The operator opens a door of the module.
(ii) The operator pulls out the telescopic drawer 1102 to a load position outside the module.
(iii) The stamp carrier 1100 is placed on the drawer mechanism.
(iv) The operator places the stamp manually on top of the stamp carrier 1100.

Thus, steps (i) to (iv) involve loading a stamp into a stamp carrier of the drawer (stamp loader) when positioned outside an imprinting location.

(v) A first one of the vacuum channels 1101, supplied via the drawer 1102, keeps the stamp in position. Thus, suction channels of the stamp carrier are used for holding the stamp on the stamp carrier.
(vi) The operator manually pushes the drawer to a park position and closes the machine door.
(vii) A pneumatic cylinder or other actuator pulls the drawer to a transfer position. The transfer position is above the stamp landing ring 502 and the chuck 500 and below the groove plate 102 as shown in FIG. 22. This thus involves moving the stamp loader (drawer and stamp carrier) to a space between the first and second carriers.
(viii) The long stroke driver 640, which supports the chuck 500 and the stamp landing ring 502, is lifted until the stamp landing ring 502 touches the stamp carrier 1100. Three support pins of the stamp carrier 1100 are centered in three holes or slots of the stamp landing ring (these can be seen in FIG. 22). This involves moving the second carrier towards the first carrier thereby to move the stamp carrier and the held stamp towards the first carrier.
(ix) The second one of the vacuum channels 1101, supplied via the stamp landing ring, takes over the clamping of the stamp and the first vacuum channel can be switched off.
(x) The long stroke driver 640 lifts the stamp carrier 1100 just a few mm above the drawer mechanism. The stamp carrier 1100 is thereby transferred from the telescopic drawer 1102 to the stamp landing ring 502.
(xi) The drawer mechanism is moved back from the transfer position to the park position by the pneumatic cylinder or other actuator, thereby to prevent a collision with the long stroke driver 640.
(xii) The long stroke driver 640 lifts the stamp carrier to just below the groove plate 102. The stamp drop protection 1104 is active (open) at this time. The held stamp is thus moved to the first carrier (groove plate).
(xiii) The grooves of the groove plate 102 are switched to vacuum so that the stamp 104 is held by the groove plate 102. Thus, there is transfer of the held stamp to the groove plate (first carrier).
(xiv) The second vacuum channel of the stamp carrier is switched off.
(xv) The long stroke driver 640 then lowers the stamp carrier 1100 to the transfer height. This moves the second carrier (chuck) away from the first carrier (groove plate).
(xvi) The stamp drop protection 1104 is then kept activated or is deactivated (closed). It can be kept activated since it cannot interfere with the stamp carrier 1100 which is now lowered.
(xvii) The drawer 1102 is moved under the stamp carrier 1100, i.e., back to the transfer position, by the pneumatic cylinder or other actuator.
(xviii) The long stroke driver 640 is lowered until the carrier 1100 is supported by the drawer. A few mm clearance is necessary.
(xix) The drawer is pulled back to its park position by the pneumatic cylinder. The stamp loader is thus moved back to a position outside the imprinting location which may be a parking position The loaded stamp is then ready to be used. The stamp is unloaded via a reverse procedure.

The integrated stamp drop protection prevents the stamp from uncontrolled dropping onto the chuck.

Typically, three or four clamps support the stamp at the corners or outside rim of the stamp. The stamp drop protection for example comprises a spring force loaded mechanism to keep the stamp clamped, during power, vacuum or air pressure loss. As outlined above, the stamp drop protection needs to be opened for loading and unloading a stamp. In a closed (clamped) position it will interfere with the stamp carrier.

During normal production cycling (i.e., not stamp loading), the stamp drop protection remains closed (i.e., clamped). It is designed not to interfere with the stamp landing device ring during the normal cycling. Openings inside or around the stamp landing ring may be used to allow all movements (linear and rotation) of the clamps.

If the stamp is not fixed to groove plate (because of an incident etc.) and it is only clamped by the stamp drop protection, the stamp can be removed by executing the normal stamp unload sequence with the stamp carrier. Manual intervention by the operator (opening the module as in the past) is not needed.

The stamp loading process is described as semi-automatic, in that the stamp is loaded manually into the drawer. However, the drawer design may be used as a step towards full automation of stamp loading and unloading in the future. In the current situation, an operator places the stamp on the carrier manually, the telescopic drawer moves the carrier in and out. In the future, this could be done by the robot of the cluster tool. This could be the robot that is now used for loading and unloading the wafers or an additional robot. The end-effector of the robot needs to be adapted to handle the stamp carrier and to supply vacuum for holding the stamp. The robot can then take over the role of the drawer. Inside the cluster tool, a stacking system can then be installed which contains stamp carriers loaded with new stamps, and empty stamp carriers.

There are various design aspects described above. They may be used alone or in combination. Notably, these design aspects are:
- the diving of the Z-axis movement of the chuck into two stages, with separate long stroke and short stroke drivers. This enables a very stiff support to be created.
- the use of a lever arrangement for a chuck actuator and/or a stamp landing ring actuator. The lever arrangement enables an increase in positioning accuracy and increased stiffness, compared to the direct control of position using the actuator output.
- a chuck which comprises a hollow cylindrical body having a top face and a bottom face and a lattice arrangement between the top and bottom faces. The chuck has a reduced thermal mass while maintaining the required stiffness for maintaining a uniform imprint gap.
- the use of landing ring actuators for translating a portion of the stamp landing ring in a Z-axis direction. Movement of the stamp landing ring in addition to movement of the chuck enables the apparatus to take account of different stamp thicknesses.
- an interface plate for mounting over the chuck with pressurized cavities to enable double-sided printing.
- a stamp support system to enable semi-automatic (or indeed fully automatic) stamp loading.
- the division of positional control between the stamp carrier and the groove plate carrier to enable overall 6 DOF control while enabling sufficient stiffness between the two.

In the examples above, the first carrier comprises an array of apertures for use in pulling the flexible stamp towards the first carrier and for use in pushing the flexible stamp away from the first carrier. A pressure source in combination with the apertures provides an actuator function. However, other actuators may be used, for example electromagnetic actuators or other actuators may be used to provide the pulling and pushing function.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. An imprinting apparatus comprising:
   a first carrier for carrying a flexible stamp having an imprinting pattern; and
   a second carrier movable relative to the first carrier and configured to carry a substrate, the substrate having a resist layer,
   wherein the second carrier comprises:
      a chuck; and
      an interface plate over the chuck, wherein the interface plate comprises an array of openings for receiving already-imprinted areas of one side of a substrate while an opposite side of the substrate is to be imprinted, and wherein the chuck comprises a fluid passage arrangement for coupling to the openings of the array.

2. The imprinting apparatus of claim 1, wherein the interface plate comprises columns of openings, wherein at least the different columns are configured to connect to different fluid passages.

3. The imprinting apparatus of claim 1, wherein the interface plate comprises a stainless steel plate.

4. The imprinting apparatus of claim 1, wherein the interface plate is between 0.5 mm and 2 mm thick.

5. The imprinting apparatus of claim 1, wherein the openings in the interface plate are formed by chemical etching.

6. The imprinting apparatus of claim 1, wherein the second carrier comprises a set of chuck actuators each for translating a portion of the chuck in a direction perpendicular to the plane of the second carrier.

7. The imprinting apparatus of claim 6, wherein each chuck actuator comprises an actuator output and a lever arrangement between the actuator output and a chuck drive member.

8. The imprinting apparatus of claim 6, further comprising:
   a main frame;
   a main frame actuator for translating the main frame in a direction perpendicular to the plane of the second carrier, wherein the chuck actuators are for translating a portion of the chuck relative to the main frame and the main frame actuator has a larger stroke than said chuck actuators.

9. The imprinting apparatus of claim 8, wherein the second carrier further comprises a sub-frame, wherein the sub-frame is connected to the main frame and the chuck is mounted to the sub-frame, wherein the sub-frame is mounted to the main frame by a spring arrangement for biasing the sub-frame against the first carrier through a kinematic coupling during imprinting.

10. The imprinting apparatus of claim 1, wherein the chuck comprises a hollow cylindrical body having a top face and a bottom face.

11. The imprinting apparatus of claim 10, wherein the chuck comprises a lattice arrangement between the top and bottom faces.

12. The imprinting apparatus of claim 10, wherein the top and bottom faces each comprise an internal water channel arrangement for providing a flow path between a set of water inlets and a water outlet.

13. An interface place for use in the imprinting apparatus of claim 1, wherein the interface plate comprises an array of openings for receiving already-imprinted areas of one side of a substrate while an opposite side of the substrate is to be imprinted, and wherein the openings are arranged for coupling to a fluid passage arrangement of a chuck of the imprinting apparatus when the interface plate is attached to the chuck.

14. The interface plate of claim 13 comprises columns (C1, C2, C3, C4) of openings, wherein at least the different columns are configured to connect to different fluid passages.

15. The interface plate of claim 13 comprising a stainless steel plate.

16. The interface plate of claim 13 wherein the interface plate is between 0.5 mm and 2 mm thick.

17. The interface plate of claim 13 wherein the openings in the interface plate are formed by chemical etching.

18. The interface plate of claim 13 wherein the interface plate has a top surface for receiving the substrate and an opposing bottom surface for attaching to the chuck and the openings extend form the top surface to the bottom surface.

19. The interface plate of claim 13 wherein the interface plate further comprises grooves for connection to fluid passages of the chuck and arranged to be located in between areas of openings 872.

* * * * *